United States Patent
Seon et al.

(10) Patent No.: US 9,508,865 B2
(45) Date of Patent: Nov. 29, 2016

(54) TRANSISTORS, METHODS OF MANUFACTURING THE SAME, AND ELECTRONIC DEVICES INCLUDING TRANSISTORS

(71) Applicant: Samsung Electronics Co., Ltd., Suwon-si, Gyeonggi-do (KR)

(72) Inventors: Jongbaek Seon, Yongin-si (KR); Seokjun Seo, Cheonan-si (KR); Taesang Kim, Seoul (KR); Myungkwan Ryu, Yongin-si (KR); Seongho Cho, Gwacheon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/664,298

(22) Filed: Mar. 20, 2015

(65) Prior Publication Data

US 2015/0280000 A1 Oct. 1, 2015

(30) Foreign Application Priority Data

Mar. 25, 2014 (KR) ........................ 10-2014-0034818

(51) Int. Cl.
  *H01L 29/10* (2006.01)
  *H01L 29/786* (2006.01)
  *H01L 29/51* (2006.01)
  *H01L 29/49* (2006.01)

(52) U.S. Cl.
  CPC ....... *H01L 29/7869* (2013.01); *H01L 29/4908* (2013.01); *H01L 29/517* (2013.01); *H01L 29/518* (2013.01); *H01L 29/78681* (2013.01); *H01L 29/78696* (2013.01)

(58) Field of Classification Search
  None
  See application file for complete search history.

(56) References Cited

U.S. PATENT DOCUMENTS

| | | | |
|---|---|---|---|
| 7,208,756 B2 | 4/2007 | Shih et al. | |
| 8,435,843 B2 | 5/2013 | Ye | |
| 2007/0026580 A1* | 2/2007 | Fujii | H01L 21/0271 438/149 |
| 2010/0072480 A1* | 3/2010 | Yoo | H01L 29/78696 257/66 |
| 2012/0056173 A1* | 3/2012 | Pieralisi | H01L 23/53238 257/43 |

FOREIGN PATENT DOCUMENTS

| | | |
|---|---|---|
| KR | 10-0799498 B1 | 1/2008 |
| WO | WO-2008-081936 A1 | 7/2008 |

OTHER PUBLICATIONS

Y. Chen et al., "Effects of FeCl3 doping on polymer-based thin film transistors", AIP Publishing LLC., Appl. Phys. vol. 96, No. 1, pp. 454-458 (Jul. 1, 2004).

* cited by examiner

*Primary Examiner* — Reema Patel
(74) *Attorney, Agent, or Firm* — Harness, Dickey & Pierce, P.L.C.

(57) ABSTRACT

According to example embodiments, a transistor includes a gate, a channel layer that is separate from the gate, a gate insulating layer between the gate and the channel layer, and a source electrode and a drain electrode respectively contacting a first region and a second region of the channel layer. The gate insulating layer includes an impurity metal containing region that includes an impurity metal and contacts the channel layer. The gate insulating layer includes an impurity metal non-containing region contacting the gate that is not doped with the impurity metal.

24 Claims, 19 Drawing Sheets

TRANSISTORS, METHODS OF MANUFACTURING THE SAME, AND ELECTRONIC DEVICES INCLUDING TRANSISTORS

RELATED APPLICATIONS

This application claims priority under 35 U.S.C. §119 to Korean Patent Application No. 10-2014-0034818, filed on Mar. 25, 2014 in the Korean Intellectual Property Office, the disclosure of which is incorporated herein in its entirety by reference.

BACKGROUND

1. Field

The present disclosure relates to transistors, methods of manufacturing the same, and/or electronic devices including the transistors.

2. Description of Related Art

Transistors are widely used as switching devices or driving devices in the field of electronic devices. In particular, since some thin film transistors may be manufactured on a glass substrate or a plastic substrate, they are useful in the field of display apparatuses such as organic light-emitting display apparatuses or liquid crystal display apparatuses.

In order to improve an operational characteristic of a transistor, a method of applying an oxide semiconductor layer having a high charge mobility as a channel layer has been attempted. Such a method is mainly applied to a thin film transistor for display apparatuses. For a transistor having an oxide semiconductor layer as a channel layer (hereinafter, referred to as oxide transistor), it is desirable to control a threshold voltage, secure stability, and improve reliability. Thus, there is a demand for development of a transistor that may satisfy excellent switching characteristics and controlled threshold voltage and reliability characteristics while exhibiting high mobility characteristics.

SUMMARY

Example embodiments relate to transistors exhibiting high mobility characteristics and excellent switching characteristics.

Provided are transistors of which characteristics such as a threshold voltage may be easily controlled.

Provided are transistors having high stability/reliability.

Provided are methods of manufacturing the transistors.

Provided are electronic devices including the transistors.

Additional aspects will be set forth in part in the description which follows and, in part, will be apparent from the description, or may be learned by practice of example embodiments.

According to example embodiments, a transistor includes a gate, a channel layer that is separate from the gate, a gate insulating layer between the gate and the channel layer, the gate insulating layer including an impurity metal containing region that includes an impurity metal and contacts the channel layer and an impurity metal non-containing region that contacts the gate and is not doped with the impurity metal, and a source electrode and a drain electrode respectively contacting a first region and a second region of the channel layer.

In example embodiments, the impurity metal containing region may include iron (Fe) as the impurity metal.

In example embodiments, the impurity metal containing region may be in a surface portion of the gate insulating layer that contacts the channel layer, and a remaining portion of the gate insulating layer, which is separate from the surface portion, may not contain the impurity metal.

In example embodiments, the impurity metal containing region may have a thickness of about 5 nm or less.

In example embodiments, the channel layer may include at least one of an oxide semiconductor, an oxynitride semiconductor, an oxynitride semiconductor containing fluorine, a nitride semiconductor, and a nitride semiconductor containing fluorine.

In example embodiments, the channel layer may include at least one of a ZnO-based semiconductor, a SnO-based semiconductor, an InO-based semiconductor, a ZnON-based semiconductor, a ZnONF-based semiconductor, a ZnN-based semiconductor, and a ZnNF-based semiconductor.

In example embodiments, the channel layer may further include at least one of Li, K, Mg, Ca, Sr, Ba, Ga, Al, In, B, Si, Sn, Ge, Sb, Y, Ti, Zr, V, Nb, Ta, Sc, Hf, Mo, Mn, Fe, Co, Ni, Cu, W, La, Ce, Pr, Nd, Pm, Sm, Eu, Gd, Tb, Dy, Ho, Er, Tm, Yb, Lu, F, Cl, Br, I, S, and Se.

In example embodiments, the gate insulating layer may include at least one of a silicon oxide layer and a silicon nitride layer. The gate insulating layer may be one of a monolayer structure and a multilayer structure.

In example embodiments, the gate insulating layer may include a silicon nitride layer and a silicon oxide layer that are sequentially stacked, and the impurity metal containing region may be in a surface portion of the silicon oxide layer.

In example embodiments, the channel layer may be on top of the gate.

In example embodiments, the transistor may further include an etch stop layer on the channel layer.

In example embodiments, a threshold voltage of the transistor may be increased in a positive (+) direction due to the impurity metal containing region.

According to example embodiments, a display apparatus may include the above-described transistor.

In example embodiments, the display apparatus may be an organic light-emitting display apparatus or a liquid crystal display apparatus.

In example embodiments, the transistor may be used as a switching device or a driving device.

According to example embodiments, a method of manufacturing a transistor includes: forming a gate, forming a gate insulating layer covering the gate, forming an impurity metal containing region that includes an impurity metal in the gate insulating layer, forming a channel layer contacting the impurity metal containing region, the channel layer being separate from the gate; and forming a source electrode and a drain electrode that respectively contact a first region and a second region of the channel layer.

In example embodiments, the impurity metal containing region may include iron (Fe) as the impurity metal.

In example embodiments, the forming the impurity metal containing region may include processing a surface portion of the gate insulating layer using a solution containing the impurity metal.

In example embodiments, the solution containing a metal component may include at least one of $FeCl_2$, $FeCl_3$, $Fe(NO_3)_3 \cdot 9H_2O$, MEA, DGME, EG, AP, TEG, JPS-1300, and PRS-2000. MEA is "monoethanolamine", DGME is "diethylene glycol monoethyl ether", EG is "ethylene glycol", AP is "1-amino-2-propanol", and TEG is "tetraethylene glycol". JPS-1300 is a product of J. T. Baker Chemical Co. and may include "1-methyl-2-pyrrolidinone", "diethylene glycol monoethyl ether", etc. PRS-2000 is a product of J. T. Baker Chemical Co. and may include "1-methyl-2-pyrrolidinone", "diethylene glycol monoethyl ether", "tetrahydro-thiophene 1,1-dioxide", "1-amino-2-propanol", "tetraethylene glycol", etc.

In example embodiments, the forming the impurity metal containing region may include the impurity metal into the surface portion of the gate insulating layer.

In example embodiments, the forming the impurity metal containing region may include forming a material layer on the gate insulating layer. The material layer may include the impurity metal.

In example embodiments, the channel layer may include at least one of an oxide semiconductor, an oxynitride semiconductor, an oxynitride semiconductor containing fluorine, a nitride semiconductor, and a nitride semiconductor containing fluorine.

In example embodiments, the channel layer may include at least one of a ZnO-based semiconductor, a SnO-based semiconductor, an InO-based semiconductor, a ZnON-based semiconductor, a ZnONF-based semiconductor, a ZnN-based semiconductor, and a ZnNF-based semiconductor.

In example embodiments, the impurity containing region may be a Fe containing region having a thickness of about 5 nm or less.

According to example embodiments, a transistor may include a gate; a channel layer that is separate from the gate, the channel layer including an inorganic semiconductor, the channel layer including an iron (Fe) containing region at a surface portion thereof; a source electrode and a drain electrode respectively contacting a first region and a second region of the channel layer; and a gate insulating layer between the channel layer and the gate.

In example embodiments, the channel layer may include at least one of an oxide semiconductor, an oxynitride semiconductor, an oxynitride semiconductor containing fluorine, a nitride semiconductor, and a nitride semiconductor containing fluorine.

In example embodiments, the channel layer may include at least one of a ZnO-based semiconductor, a SnO-based semiconductor, an InO-based semiconductor, a ZnON-based semiconductor, a ZnONF-based semiconductor, a ZnN-based semiconductor, and a ZnNF-based semiconductor.

In example embodiments, the iron (Fe) containing region may have a thickness of about 5 nm or less.

In example embodiments, the gate may be on top of the channel layer.

In example embodiments, the channel layer may be on top of the gate.

In example embodiments, the gate insulating layer may include an impurity metal containing region that includes an impurity metal at a surface portion of the gate insulating layer.

In example embodiments, the impurity metal containing region may be a region including iron (Fe) as the impurity metal.

According to example embodiments, a display apparatus may include the above-described transistor.

In example embodiments, the display apparatus may be an organic light-emitting display apparatus or a liquid crystal display apparatus.

In example embodiments, the transistor may be used as a switching device or a driving device.

According to example embodiments, a method of manufacturing a transistor including a channel layer, a source, a drain, a gate, and a gate insulating layer is provided. The method includes forming the channel layer, the channel layer including an inorganic semiconductor; forming an iron (Fe) containing region in a surface portion of the channel layer; and forming the gate insulating layer and the gate, the gate being separate from the channel layer, the gate insulating layer being between the gate and the channel layer.

In example embodiments, the forming the iron (Fe) containing region may include processing the surface portion of the channel layer using a solution containing an iron (Fe) component.

In example embodiments, the solution containing an iron (Fe) component may include at least one of $FeCl_2$, $FeCl_3$, $Fe(NO_3)_3 \cdot 9H_2O$, monoethanolamine (MEA), diethylene glycol monoethyl ether (DGME), ethylene glycol (EG), 1-amino-2-propanol (AP), tetraethylene glycol (TEG), 1-methyl-2-pyrrolidinone, tetrahydrothiophene 1,1-dioxide, and 1-amino-2-propanol In example embodiments, the forming the iron (Fe) containing region may include injecting the iron (Fe) component into the surface portion of the gate insulating layer by using ion implantation.

In example embodiments, the channel layer may include at least one of an oxide semiconductor, an oxynitride semiconductor, an oxynitride semiconductor containing fluorine, a nitride semiconductor, and a nitride semiconductor containing fluorine.

In example embodiments, the channel layer may include at least one of a ZnO-based semiconductor, a SnO-based semiconductor, an InO-based semiconductor, a ZnON-based semiconductor, a ZnONF-based semiconductor, a ZnN-based semiconductor, and a ZnNF-based semiconductor.

In example embodiments, the method may further include forming an impurity metal containing region in a surface portion of the gate insulating layer. The impurity metal containing region may be a Fe containing region.

According to example embodiments, a transistor includes: a gate; a source electrode and a drain electrode spaced apart from each other; a channel layer, a gate insulating layer, and at least one impurity metal containing region between the gate and the source and the drain electrodes. The channel layer includes an inorganic semiconductor, a first region connected to the source electrode, and a second region connected to the drain electrode. The gate insulating layer is on top of one of the gate and the channel layer. An other of the gate and the channel layer is on top of the gate insulating layer. The impurity metal containing region is defined by a region containing an impurity metal in at least one of the gate insulating layer and the channel layer.

In example embodiments, the impurity metal may be iron (Fe).

In example embodiments, the impurity metal containing region may be defined by a region containing the impurity metal in the gate insulating layer. The impurity metal containing region may include a surface portion of the gate insulating layer that contacts the channel layer. A remaining portion of the gate insulating layer, which is separate from the impurity metal containing region, may be not doped with the impurity metal.

In example embodiments, the impurity metal containing region may be defined by a region containing the impurity metal in the channel layer. A remaining portion of the channel layer, which is separate from the impurity metal containing region, is not doped with the impurity metal.

In example embodiments, the channel layer may include at least one of an oxide semiconductor, an oxynitride semiconductor, an oxynitride semiconductor containing fluorine, a nitride semiconductor, and a nitride semiconductor containing fluorine.

BRIEF DESCRIPTION OF THE DRAWINGS

These and/or other aspects will become apparent and more readily appreciated from the following description of non-limiting embodiments, taken in conjunction with the accompanying drawings in which like reference characters refer to like parts throughout the different views. The drawings are not necessarily to scale, emphasis instead being placed upon illustrating principles of inventive concepts. In the drawings.

DETAILED DESCRIPTION

Figure 1:
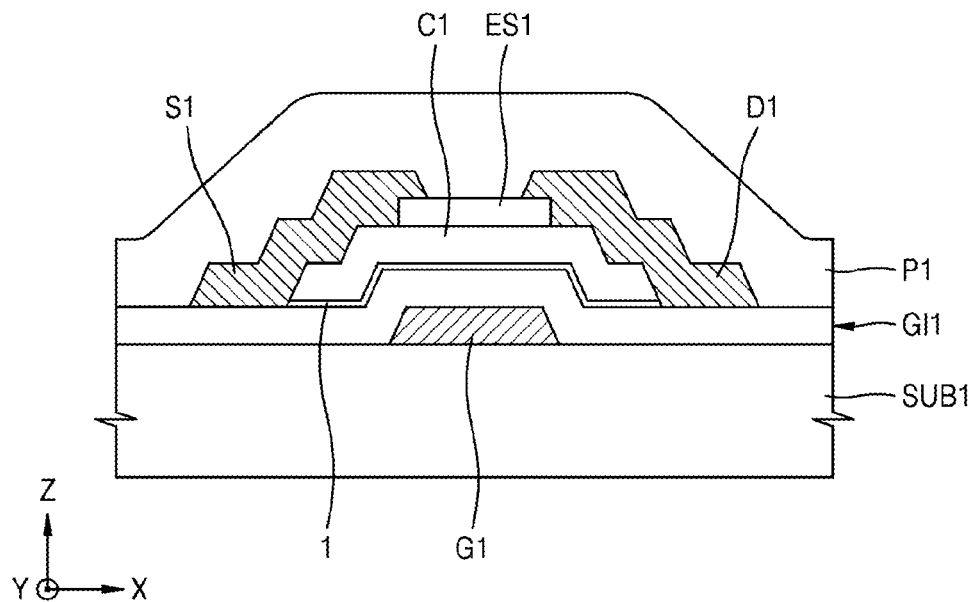
FIG. 1 is a cross-sectional view of a transistor according to example embodiments of inventive concepts.

Example embodiments will now be described more fully with reference to the accompanying drawings, in which some example embodiments are shown. Example embodiments, may, however, be embodied in many different forms and should not be construed as being limited to the embodiments set forth herein; rather, these example embodiments are provided so that this disclosure will be thorough and complete, and will fully convey the scope of example embodiments of inventive concepts to those of ordinary skill in the art. In the drawings, the thicknesses of layers and regions are exaggerated for clarity. Like reference characters and/or numerals in the drawings denote like elements, and thus their description may be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items. Expressions such as "at least one of," when preceding a list of elements, modify the entire list of elements and do not modify the individual elements of the list.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to a non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Hereinafter, transistors, methods of manufacturing transistors, and electronic devices including transistors according to example embodiments of inventive concepts will be described in detail with reference to the attached drawings. Also, the width and thickness of each layer or area illustrated in the drawings may be exaggerated for convenience of explanation and clarity. Like reference numerals in the drawings denote like elements.

FIG. 1 is a cross-sectional view of a transistor according to example embodiments of inventive concepts. In example embodiments, the transistor may be a thin film transistor having a bottom gate structure in which a gate electrode G1 is provided below a channel layer C1.

Referring to FIG. 1, the gate electrode G1 may be provided on a substrate SUB1. The substrate SUB1 may be a glass substrate or any of various substrates used in a general semiconductor device process, for example, a plastic substrate or a silicon substrate. The gate electrode G1 may be formed of a general electrode material such as a metal, an alloy, a conductive metal oxide, or a conductive metal nitride. The gate electrode G1 may have a monolayer structure or a multilayer structure.

The channel layer C1 may be provided above the gate electrode G1. The width of the channel layer C1 in an X-axis direction may be greater than the width of the gate electrode G1 in the X-axis direction. However, in some cases, the width of the channel layer C1 may be similar to or less than the width of the gate electrode G1. The channel layer C1 may be formed of inorganic semiconductor. The channel layer C1 may include at least one of oxide semiconductor, oxynitride semiconductor, oxynitride semiconductor containing fluorine, nitride semiconductor, and nitride semiconductor containing fluorine. In a detailed example, the channel layer C1 may include at least one of a ZnO-based semiconductor, a SnO-based semiconductor, an InO-based semiconductor, a ZnON-based semiconductor, a ZnONF-based semiconductor, a ZnN-based semiconductor, and a ZnNF-based semiconductor. In this case, the channel layer C1 may further include an additional element X. The additional element X may include at least one of a group I element, a group II element, a group III element, a group IV element, a group V element, a transition metal element, and a lanthanide. In a detailed example, the additional element X may include at least one of Li, K, Mg, Ca, Sr, Ba, Ga, Al, In, B, Si, Sn, Ge, Sb, Y, Ti, Zr, V, Nb, Ta, Sc, Hf, Mo, Mn, Fe, Co, Ni, Cu, W, La, Ce, Pr, Nd, Pm, Sm, Eu, Gd, Tb, Dy, Ho, Er, Tm, Yb, and Lu. Alternatively, the additional element X may include at least one of a group VI element and a group VII element. In a detailed example, the additional element X may include at least one of F, Cl, Br, I, S, and Se. The channel layer C1 may have a Hall mobility of about 10 $cm^2/Vs$ or more, or about 20 $cm^2/Vs$ or more. The Hall mobility of the channel layer C1 may be increased to about 100 $cm^2/Vs$ or more according to forming conditions. The carrier concentration of the channel layer C1 may be, for example, about $10^{11}$~$10^{18}/cm^3$ or about $10^{12}$~$10^{17}/cm^3$. The conductivity type of the channel layer C1 may be an n-type and thus the carrier concentration may signify a concentration of electrons. In the above description, ZnO, ZnON, ZnONF, ZnN, and ZnNF are a mere listing of constituent elements in which a composition ratio of the constituent elements is disregarded. For example, the expression "ZnONF" does not signify that a composition ratio of Zn, O, N, and F is 1:1:1:1, but signifies a material (a compound) that is merely formed with Zn, O, N, and F. This applies to the other parts of the present specification.

Figure 26A:
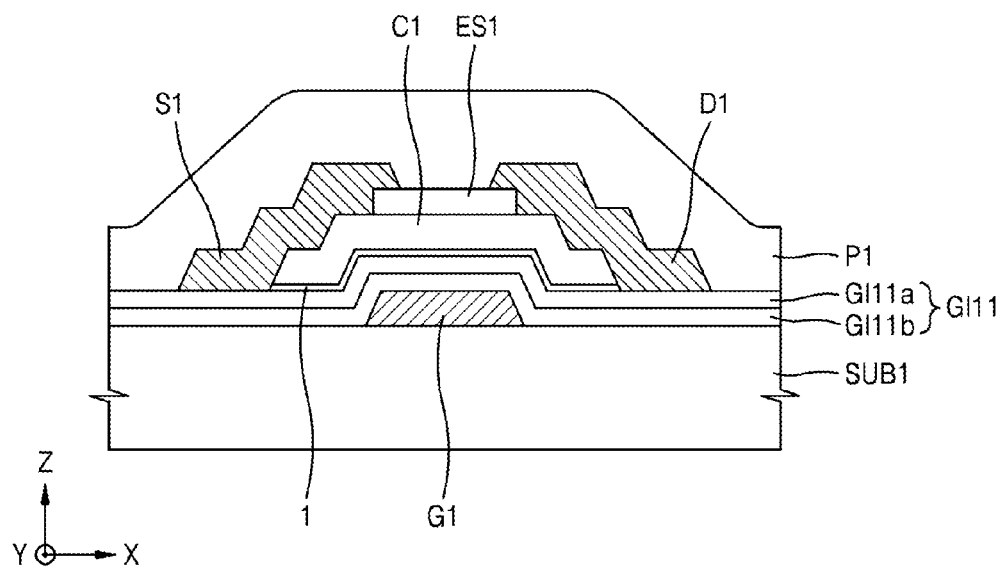
FIGS. 26A and 26B are cross-sectional views of transistors according to example embodiments of inventive concepts.

A gate insulating layer GI1 may be provided between the gate electrode G1 and the channel layer C1. The gate insulating layer GI1 may be provided on the substrate SUB1 and cover the gate electrode G1. The gate electrode G1 may be provided on the gate insulating layer GI1. The gate insulating layer GI1 may include a silicon oxide layer, a silicon oxynitride layer, or a silicon nitride layer, or may include another material layer, for example, a high-k material layer having a greater dielectric constant than that of the silicon nitride layer. The gate insulating layer GI1 may have a monolayer or multilayer structure including at least one of a silicon oxide layer, a silicon oxynitride layer, a silicon nitride layer, and a high-k material layer. In a detailed example, the gate insulating layer GI1 may have a stacked structure of a silicon nitride layer and a silicon oxide layer. In this case, the silicon nitride layer and the silicon oxide layer may be sequentially provided on the gate electrode G1. For example, FIG. 26A illustrates a transistor according to example embodiments that is the same as the transistor in FIG. 1, except the transistor in FIG. 26A includes a gate insulating layer GI11 with a first gate insulating layer GI11a on a second gate insulating layer GI11b. The impurity metal containing region 1 may be formed in a surface portion of the first gate insulating layer GI11a.

The gate insulating layer GI1 may include an impurity metal containing region 1. The impurity metal containing region 1 may be provided to contact the channel layer C1. The impurity metal containing region 1 may be provided in a surface portion of the gate insulating layer GI1. The channel layer C1 may be provided on the impurity metal containing region 1. In the gate insulating layer GI1, the other region (remaining portion) except for the impurity metal containing region 1 may be a region that does not contain impurity metal, that is, an "impurity metal non-containing region". In other words, the impurity metal non-containing region may be a region that is not intentionally doped with the impurity metal. The impurity metal non-containing region may contact the gate electrode G1. In other words, the gate insulating layer GI1 may include the impurity metal containing region 1 contacting the channel layer C1 and the impurity metal non-containing region contacting the gate electrode G1. When the gate insulating layer GI1 includes the silicon nitride layer and the silicon oxide layer that are sequentially stacked, the impurity metal containing region 1 may be provided in a surface portion of the silicon oxide layer.

The impurity metal containing region 1 may be, for example, an iron (Fe) containing region. The impurity metal containing region 1 may be a region in which an iron component is contained in a base material (insulating material) which is the same as the other region (remaining portion) of the gate insulating layer GI1. Even when the impurity metal containing region 1 includes a metal such as iron (Fe), a concentration of the metal included in the impurity metal containing region 1 may be relatively low. Thus, the impurity metal containing region 1 may maintain "insulation characteristics". Accordingly, the impurity metal containing region 1 may be an insulator, and may be considered as a part of the gate insulating layer GI1. The impurity metal containing region 1 may have a thickness of about 10 nm (e.g., between about 1 nm about 10 nm) or about 5 nm or less (e.g., between about 1 nm about 5 nm). The characteristics, such as a threshold voltage, of a transistor may be easily controlled by the impurity metal containing region 1 and also stability/reliability of the transistor may be improved due to the impurity metal containing region 1, which will be described later in more detail.

An etch stop layer ES1 may be provided on the channel layer C1. The width of the etch stop layer ES1 in the X-axis direction may be less than the width of the channel layer C1 in the X-axis direction. The opposite ends of the channel layer C1 may not be covered by the etch stop layer ES1. The etch stop layer ES1 may include, for example, silicon oxide, silicon oxynitride, silicon nitride, or an organic insulation material.

A source electrode S1 and a drain electrode D1 may be provided on the gate insulating layer GI1 to contact first and second regions, for example, opposite ends, of the channel layer C1, respectively. The source electrode S1 and the drain electrode D1 may have a monolayer structure or a multilayer structure. The source electrode S1 and the drain electrode D1 may be formed of a metal, an alloy, a conductive metal oxide, a conductive metal nitride, or the like. The material of the source electrode S1 and the drain electrode D1 may be substantially the same as or similar to that of the gate electrode G1. The source electrode S1 and the drain electrode D1 may be the same material layer as the gate electrode G1 or may be a different material layer from the gate electrode G1. The source electrode S1 may have a structure that contacts the first region, for example, one end, of the channel layer C1 and extends over one end of the etch stop layer ES1. The drain electrode D1 may have a structure that contacts the second region, for example, the other end, of the channel layer C1 and extends over the other end of the etch stop layer ES1. The etch stop layer ES1 may prevent the channel layer C1 from being damaged by etching performed in an etch process for forming the source electrode S1 and the drain electrode D1.

A passivation layer P1 may be provided on the gate insulating layer GI1 and covers the etch stop layer ES1, the source electrode S1, and the drain electrode D1. The passivation layer P1 may be a silicon oxide layer, a silicon oxynitride layer, a silicon nitride layer, or an organic layer, or a structure in which at least two thereof are stacked. For example, the passivation layer P1 may have a monolayer structure formed of silicon oxide or a silicon nitride, or a multilayer structure including a silicon oxide layer and a silicon nitride layer provided on the silicon oxide layer. Also, the passivation layer P1 may have a multilayer structure having a triple layer or more. In this case, the passivation layer P1 may sequentially include a silicon oxide layer, a silicon oxynitride layer, and a silicon nitride layer. In addition, the passivation layer P1 may have various structures. The thicknesses of the gate electrode G1, the gate insulating layer GI1, the source electrode S1, the drain electrode D1, and the passivation layer P1 may be about 50~300 nm, about 50~400 nm, about 10~200 nm, about 10~200 nm, and about 50~1200 nm, respectively. However, a range of the thicknesses thereof may vary as occasion demands.

The use of the etch stop layer ES1 may be determined according to the material of the channel layer C1 and the materials of the source electrode S1 and the drain electrode D1. Alternatively, the use of the etch stop layer ES1 may be determined according to the etch process for forming the source electrode S1 and the drain electrode D1. Accordingly, in some cases, the etch stop layer ES1 may be excluded from the structure of FIG. 1 and an example thereof is illustrated in FIG. 2.

Figure 2:
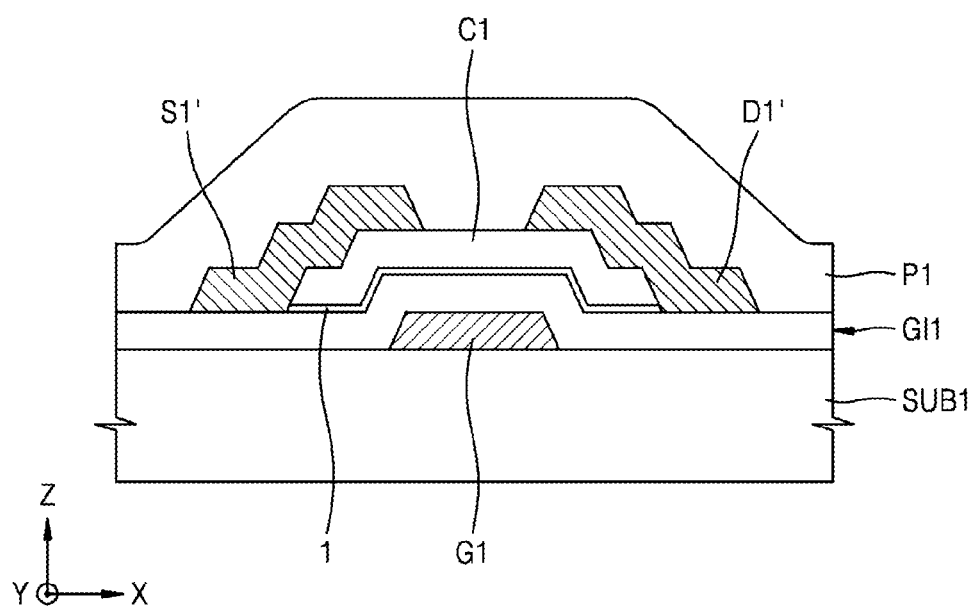
FIG. 2 is a cross-sectional view of a transistor according to example embodiments of inventive concepts.

Referring to FIG. 2, a source electrode S1' may contact a first region, for example, one end, of the channel layer C1, and a drain electrode D1' may contact a second region, for example, the other end, of the channel layer C1. The source electrode S1' may extend toward a portion of the gate insulating layer GI1 adjacent to the first region, and similarly, the drain electrode D1' may extend toward a portion of the gate insulating layer GI1 adjacent to the second region. A transistor of FIG. 2 may be similar to or the same as the transistor of FIG. 1, except that the etch stop layer ES1 of FIG. 1 is not used and the shapes of the source electrode S1' and the drain electrode D1' are slightly altered. In the transistor of FIG. 2, a back channel area of the channel layer C1 may be exposed during the etch process. In this point of view, the transistor of FIG. 2 may be referred as a back channel etch structure or an etch back structure.

In FIGS. 1 and 2, a portion of the channel layer C1 contacting the impurity metal containing region 1 of the gate insulating layer GI1 may be doped with an impurity metal, for example, Fe. In other words, the impurity metal, for example, Fe, of the impurity metal containing region 1 may diffuse into a region of the channel layer C1 adjacent thereto. In this case, the channel layer C1 may have an impurity metal doping region (not shown) in a boundary portion (lower surface portion) contacting the gate insulating layer GI1. The impurity metal doping region may be a region doped with, for example, iron (Fe).

FIGS. 3A to 3F are cross-sectional views illustrating a method of manufacturing a transistor, according to example embodiments of inventive concepts. FIGS. 3A to 3F relate to a method of manufacturing a thin film transistor having a bottom gate structure according to example embodiments.

Figure 3A:
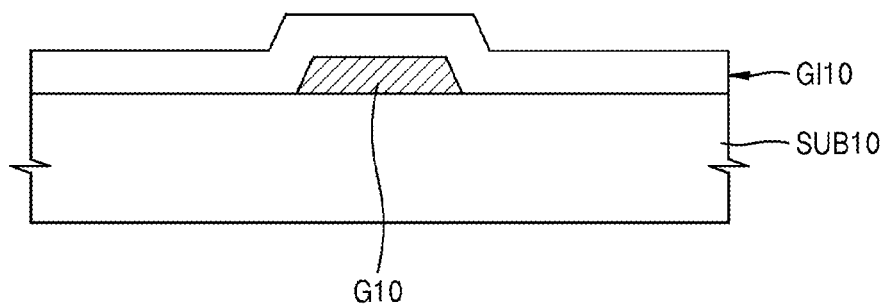
FIGS. 3A to 3F are cross-sectional views illustrating a method of manufacturing a transistor, according to example embodiments of inventive concepts.

Referring to FIG. 3A, a gate electrode G10 may be formed on a substrate SUB10. The substrate SUB10 may be a glass substrate or any of various substrates used in a general semiconductor device process, for example, a plastic substrate or a semiconductor substrate (e.g., silicon substrate). The gate electrode G10 may be formed of a general electrode material such as a metal, an alloy, a conductive metal oxide, and/or a conductive metal nitride. The gate electrode G10 may have a monolayer structure or a multilayer structure.

Next, a gate insulating layer GI10 may be formed on the substrate SUB10 so as to cover the gate electrode G10. The gate insulating layer GI10 may be formed of silicon oxide, silicon oxynitride, or silicon nitride, or may be formed of another material, for example, a high-k material having a greater dielectric constant than that of the silicon nitride. The gate insulating layer GI10 may be formed to have a monolayer or multilayer structure including at least one of a silicon oxide layer, a silicon oxynitride layer, a silicon nitride layer, and a high-k material layer. In a detailed example, the gate insulating layer GI10 may have a stacked structure of a silicon nitride layer and a silicon oxide layer. In this case, the silicon nitride layer and the silicon oxide layer may be sequentially stacked on the gate electrode G10, thereby forming the gate insulating layer GI10.

Figure 3B:
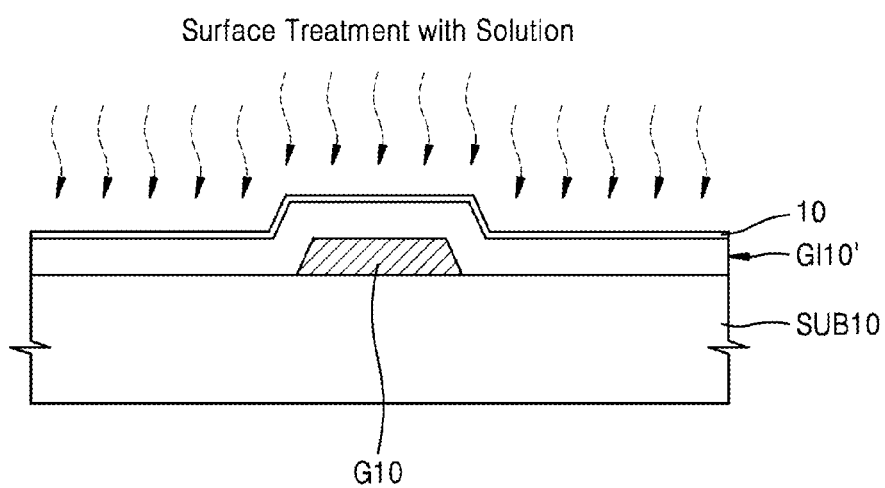

Referring to FIG. 3B, an impurity metal containing region 10 may be formed in a surface portion (upper surface portion) of the gate insulating layer GI10. For example, the impurity metal containing region 10 may be formed by processing (treating) the surface portion of the gate insulating layer GI10 by using a solution containing a metal component. A gate insulating layer where the impurity metal containing region 10 is formed is indicated by GI10'. When the gate insulating layer GI10 has a structure in which the silicon nitride layer and the silicon oxide layer are sequentially stacked, the impurity metal containing region 10 may be formed within the surface portion of the silicon oxide layer. The impurity metal containing region 10 may have a thickness of about 10 nm or less (e.g., between about 1 nm about 10 nm) or about 5 nm or less (e.g., between about 1 nm about 5 nm).

The impurity metal containing region 10 may be a region containing, for example, iron (Fe). In this case, the solution containing a metal component may include at least one of, for example, $FeCl_2$, $FeCl_3$, $Fe(NO_3)_3 \cdot 9H_2O$, monoethanolamine (MEA), diethylene glycol monoethyl ether (DGME), ethylene glycol (EG), 1-amino-2-propanol (AP), tetraethylene glycol (TEG), JPS-1300, and PRS-2000. JPS-1300 that is a product of J. T. Baker Chemical Co. may include "1-methyl-2-pyrrolidinone" and "diethylene glycol monoethyl ether" and further include an amine-based material, a glycol-based material, or a desired (and/or alternatively predetermined) solvent. PRS-2000 that is a product of J. T. Baker Chemical Co. may include "1-methyl-2-pyrrolidinone", "diethylene glycol monoethyl ether", "tetrahydrothiophene 1,1-dioxide", "1-amino-2-propanol", "tetraethylene glycol", etc. Among the above materials, $FeCl_2$, $FeCl_3$, and $Fe(NO_3)_3 \cdot 9H_2O$ may be dissolved in water (deionized water) to an appropriate concentration, for example, about a few to several hundreds of micromoles, to be used in a solution state. On the other hand, MEA, DGME, EG, AP, TEG, JPS-1300, and PRS-2000 may be materials in a solution state including an organic solvent. These materials may include an iron (Fe) component. Alternatively, an external iron (Fe) component may be added to the materials. The solution containing a metal component may have a pH of about 6~11. Since reactivity of the surface processing (surface treatment) may vary according to pH of the solution, it may be suitable that the solution has a pH of about 6~11. However, a suitable range of pH may vary as occasion demands. The impurity metal containing region 10 may be formed through a dipping process in which the substrate SUB10, on which the gate insulating layer GI10 is formed, is dipped in the solution containing a metal component for a desired (and/or alternatively predetermined) time, for example, a few seconds to several hours or about one minute to about 10 minutes. An ultrasonic application process may be performed during the dipping process, as necessary. A cleaning process may be performed after the dipping process. The cleaning process may be performed by sequentially using, for example, 2-propanol and deionized (DI) water. Each of the 2-propanol and the DI water may be used in the cleaning process for about 5 minutes. However, the cleaning solution or the cleaning time may be variously changed.

Figure 3C:
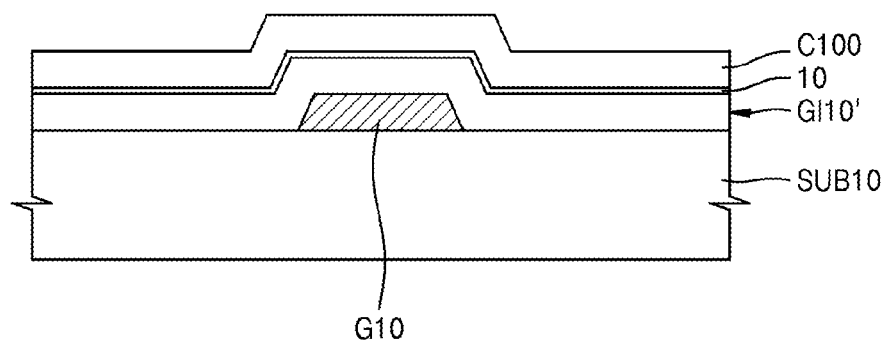

Referring to FIG. 3C, a semiconductor layer C100 for a channel may be formed on the gate insulating layer GI10'. The semiconductor layer C100 may be formed of an inorganic semiconductor. The semiconductor layer C100 may include at least one of an oxide semiconductor, an oxynitride semiconductor, an oxynitride semiconductor containing fluorine, a nitride semiconductor, and a nitride semiconductor containing fluorine. For example, the semiconductor layer C100 may include at least one of a ZnO-based semiconductor, a SnO-based semiconductor, an InO-based semiconductor, a ZnON-based semiconductor, a ZnONF-based semiconductor, a ZnN-based semiconductor, and a ZnNF-based semiconductor. In this case, the semiconductor layer C100 may further include an additional element X. The additional element X may include at least one of a group I element, a group II element, a group III element, a group IV element, a group V element, a transition metal element, and a lanthanide. In a detailed example, the additional element X may include at least one of Li, K, Mg, Ca, Sr, Ba, Ga, Al, In, B, Si, Sn, Ge, Sb, Y, Ti, Zr, V, Nb, Ta, Sc, Hf, Mo, Mn, Fe, Co, Ni, Cu, W, La, Ce, Pr, Nd, Pm, Sm, Eu, Gd, Tb, Dy, Ho, Er, Tm, Yb, and Lu. Alternatively, the additional element X may include at least one of a group VI element and a group VII element. In a detailed example, the additional element X may include at least one of F, Cl, Br, I, S, and Se. The thickness of the semiconductor layer C100 may be about 10~150 nm, for example, about 20~100 nm. However, a range of an appropriate thickness thereof may vary.

Figure 3D:
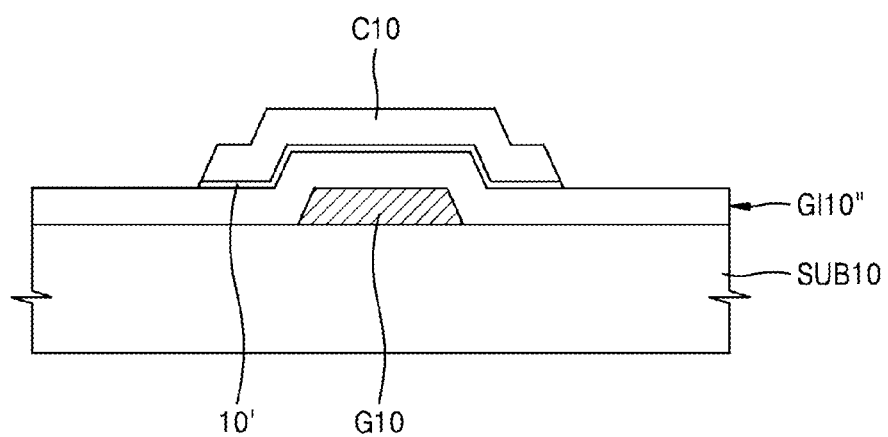

Next, the semiconductor layer C100 may be annealed, that is, thermally treated. The annealing may be performed at a temperature of about 450° C. or lower, for example, about 150~450° C. Also, the annealing may be performed in a $N_2$, $O_2$, or air atmosphere. The semiconductor layer C100 may be stabilized through the annealing. Also, a protection film (not shown) may be thinly formed on a surface portion of the semiconductor layer C100 by the annealing. The protection film may be a surface oxide film or an oxygen-rich material film. The protection film may have a density that is relatively higher than that of the semiconductor layer C100 thereunder. The annealing process may be performed at a different point of time. For example, the annealing process may be performed after the semiconductor layer C100 is patterned, as illustrated in FIG. 3D. However, the annealing process is optional and thus it may not be performed in some cases.

A channel layer C10 may be formed by patterning the semiconductor layer C100, as illustrated in FIG. 3D. The channel layer C10 may be provided above the gate electrode G10. The channel layer C10 may be arranged to face the gate electrode G10. The material, physical properties, and characteristics of the channel layer C10 may be the same as those of the channel layer C1 of FIG. 1.

When the channel semiconductor layer C100 is patterned (etched), the impurity metal containing region 10 may be patterned (etched) also. In other words, the impurity metal containing region 10 may be patterned into the same planar shape as the channel layer C10. The patterned impurity metal containing region is indicated by a reference number 10'. A gate insulating layer, including the patterned impurity metal containing region 10', is indicated by a reference number GI10". However, in some cases, the impurity metal containing region 10 may maintain the shape as illustrated in FIG. 3C and not be patterned. Alternatively, only a thickness of the impurity metal containing region 10 around the channel layer C10 may be removed and the other portion thereof may remain.

Figure 3E:
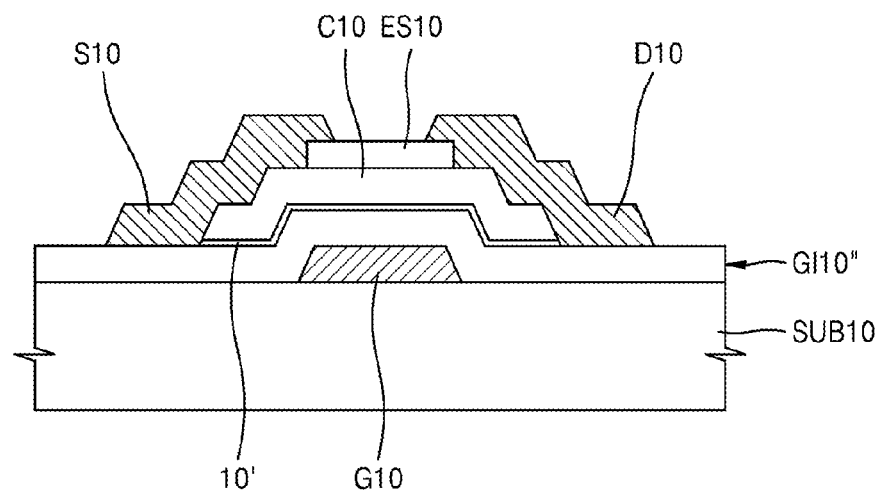

Referring to FIG. 3E, an etch stop layer ES10 may be formed on the channel layer C10. The etch stop layer ES10 may be formed on a center portion (or in an area adjacent thereto) of the channel layer C10. Accordingly, portions of the channel layer C10 at the opposite sides of the etch stop layer ES10 may be exposed by not being covered with the etch stop layer ES10. The etch stop layer ES10 may be formed of, for example, silicon oxide, silicon oxynitride, silicon nitride, or an organic insulation material.

Next, a source electrode S10 and a drain electrode D10 may be formed on the gate insulating layer GI10" to respectively contact first and second regions, for example, the opposite sides, of the channel layer C10. The source electrode S10 may have a structure contacting the first region (one end) and extending over one end of the etch stop layer ES10. The drain electrode D10 may have a structure contacting the second region (the other end) and extending over the other end of the etch stop layer ES10. After a desired (and/or alternatively predetermined) conductive film is formed on the gate insulating layer GI10" to cover the channel layer C10 and the etch stop layer ES10, the conductive film may be patterned (etched) so as to form the source electrode S10 and the drain electrode D10. In doing so, the etch stop layer ES10 may prevent the channel layer C10 from being damaged by an etch process for forming the source electrode S10 and the drain electrode D10. The source electrode S10 and the drain electrode D10 may be the same material layer as the gate electrode G10 or may be a different material layer therefrom. The source electrode S10 and the drain electrode D10 may be formed in a monolayer or multilayer structure.

Figure 3F:
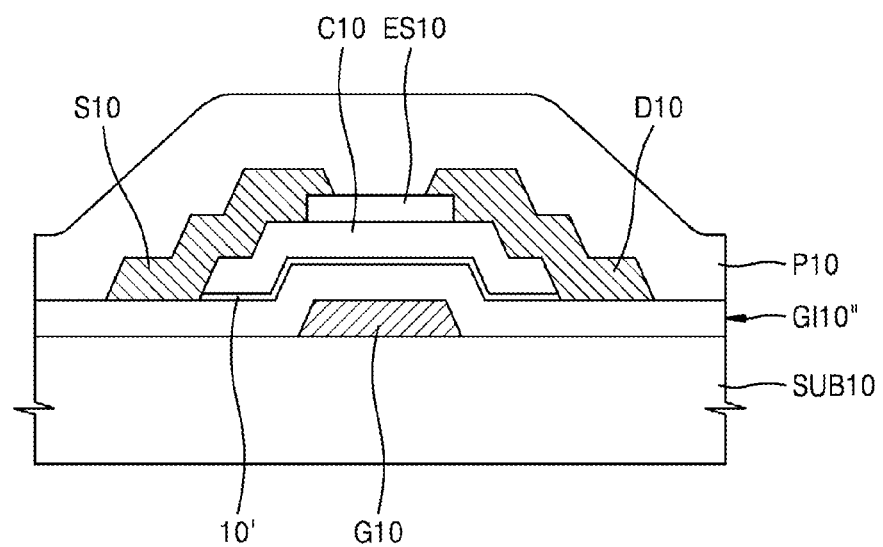

Referring to FIG. 3F, a passivation layer P10 may be formed on the gate insulating layer GI10 to cover the etch stop layer ES10, the source electrode S10, and the drain electrode D10. The passivation layer P10 may be formed as, for example, a silicon oxide layer, a silicon oxynitride layer, a silicon nitride layer, or an organic insulating layer, or a structure in which at least two thereof are stacked. A desired (and/or alternatively predetermined) annealing process may be performed before or after the passivation layer P10 is formed.

The impurity metal of the impurity metal containing region 10 and/or 10' may be diffused into a portion of the channel (semiconductor) layer C100 and/or C10 adjacent thereto by the annealing process described with reference to FIG. 3C and/or the annealing process described with reference to FIG. 3F. Accordingly, the channel layer C10 of FIG. 3F may have an impurity metal doping region (not shown) in a boundary portion (lower surface portion) contacting the gate insulating layer GI10".

The manufacturing method described with reference to FIGS. 3A to 3F may be an example of the method of manufacturing the transistor of FIG. 1. The transistor of FIG. 2 may be manufactured by modifying the method of FIG. 3A to 3F. For example, in the operation of FIG. 3E, the source electrode S10 and the drain electrode D10 may be formed without forming the etch stop layer ES10. The use of the etch stop layer ES10 may be determined according to the material of the channel layer C10 and the materials of the source electrode S10 and the drain electrode D10. Alternatively, the use of the etch stop layer ES10 may be determined according to the etch process for forming the source electrode S10 and the drain electrode D10. Accordingly, in some cases, the subsequent process may be performed without the etch stop layer ES10 and consequently the transistor of FIG. 2 may be manufactured.

Also, the process of forming the impurity metal containing region 10 in FIG. 3B may be variously changed. For example, an impurity metal containing region may be formed through a process of injecting metal ions in the surface portion of the gate insulating layer GI10 (ion implantation process). Alternatively, an impurity metal containing region may be formed by a process of forming a material layer (insulation layer), including an impurity metal, on the gate insulating layer GI10. In this case, the material layer including the impurity metal may be the impurity metal containing region.

Figure 4:
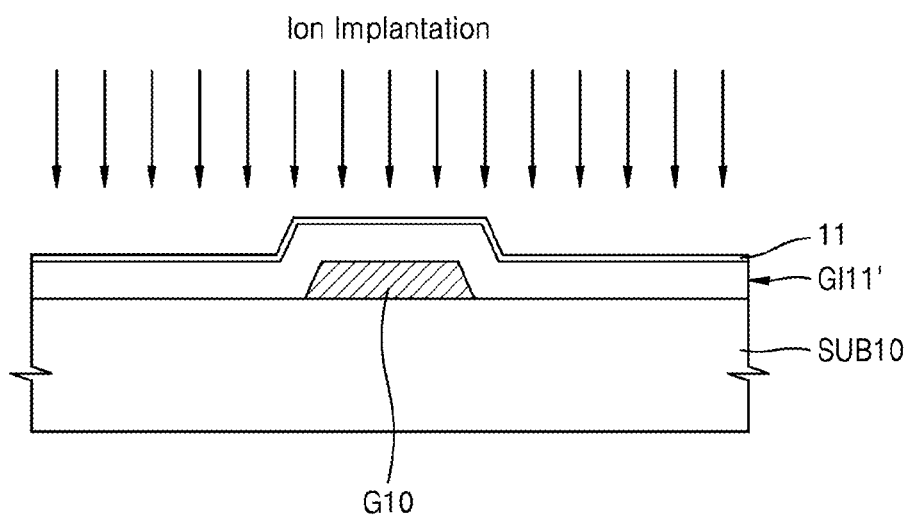
FIG. 4 is a cross-sectional view for explaining a method of manufacturing a transistor, according to example embodiments of inventive concepts.
Figure 5:
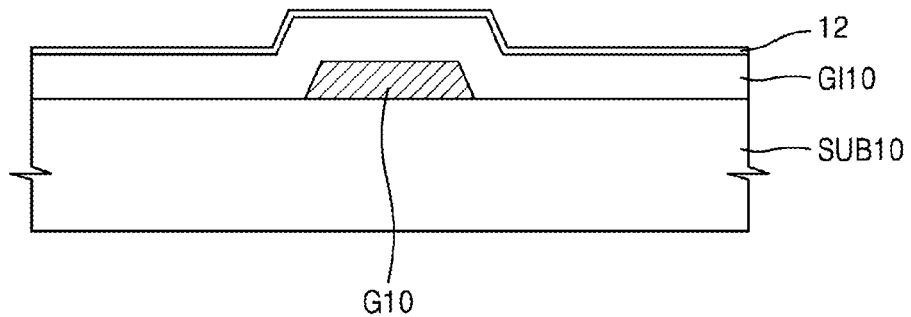
FIG. 5 is a cross-sectional view for explaining a method of manufacturing a transistor, according to example embodiments of inventive concepts.

FIGS. 4 and 5 respectively illustrate the former and latter cases. FIG. 4 illustrates a case in which an impurity metal containing region 11 is formed by an ion implantation process. In FIG. 4, a reference number GI11' denotes a gate insulating layer having a surface portion where the impurity metal containing region 11 is formed. FIG. 5 illustrates a case in which a material layer 12 including an impurity metal is formed on the gate insulating layer GI10. The material layer 12 including the impurity metal may be formed by various methods such as sputtering, chemical vapor deposition (CVD), atomic layer deposition (ALD), or a sol-gel method.

Figure 6:
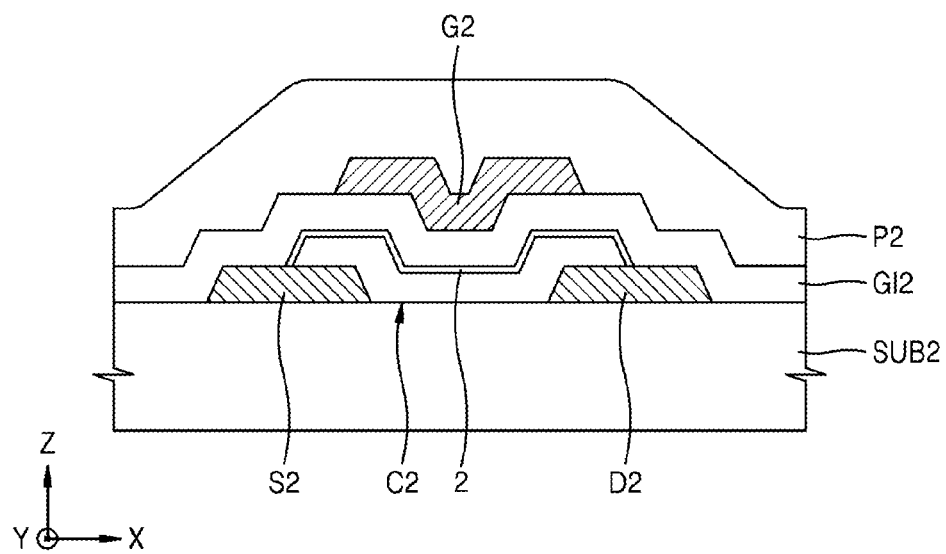
FIG. 6 is a cross-sectional view of a transistor according to example embodiments of inventive concepts.

FIG. 6 is a cross-sectional view of a transistor according to example embodiments of inventive concepts that is a thin film transistor having a top gate structure in which a gate electrode G2 is provided above a channel layer C2.

Referring to FIG. 6, a source electrode S2 and a drain electrode D2 may be separately provided on a substrate SUB2. The channel layer C2 may be provided on the substrate SUB2 between the source electrode S2 and the drain electrode D2 and may contact the source electrode S2 and the drain electrode D2. The material of the channel layer C2 may be substantially the same as or similar to the material of the channel layer C1 of FIG. 1. In other words, the channel layer C2 may be formed of an inorganic semiconductor and may include at least one of an oxide semiconductor, an oxynitride semiconductor, an oxynitride semiconductor containing fluorine, a nitride semiconductor, and a nitride semiconductor containing fluorine. For example, the channel layer C2 may include at least one of a ZnO-based semiconductor, a SnO-based semiconductor, an InO-based semiconductor, a ZnON-based semiconductor, a ZnONF-based semiconductor, a ZnN-based semiconductor, and a ZnNF-based semiconductor. In this case, the channel layer C2 may further include an additional element X. The additional element X may include at least one of a group I element, a group II element, a group III element, a group IV element, a group V element, a transition metal element, and a lanthanide. In a detailed example, the additional element X may include at least one of Li, K, Mg, Ca, Sr, Ba, Ga, Al, In, B, Si, Sn, Ge, Sb, Y, Ti, Zr, V, Nb, Ta, Sc, Hf, Mo, Mn, Fe, Co, Ni, Cu, W, La, Ce, Pr, Nd, Pm, Sm, Eu, Gd, Tb, Dy, Ho, Er, Tm, Yb, and Lu. Alternatively, the additional element X may include at least one of a group VI element and a group VII element. In a detailed example, the additional element X may include at least one of F, Cl, Br, I, S, and Se. The thickness of the channel layer C2 may be about 10~150 nm, for example, about 20~100 nm. However, a thickness range of the channel layer C2 may vary as occasion demands.

The channel layer C2 may include an impurity metal containing region 2 in a surface portion thereof. The impurity metal containing region 2 may be a region containing, for example, iron (Fe). The impurity metal containing region 2 may be a region containing an iron (Fe) component in a base material (semiconductor material) that is the same as the other region (remaining portion) of the channel layer C2. Even when the impurity metal containing region 2 includes a metal such as iron (Fe), a concentration of the included metal may be relatively low and the impurity metal containing region 2 may maintain "semiconductor characteristics". Accordingly, the impurity metal containing region 2 may be a semiconductor and may be regarded as a portion of the channel layer C2. The impurity metal containing region 2 may have a thickness of about 10 nm or less (e.g., between about 1 nm about 10 nm) or about 5 nm or less (e.g., between about 1 nm about 5 nm). The other region (remaining portion) of the channel layer C2, except for the impurity metal containing region 2, may not include iron (Fe) as an impurity metal. In other words, the other region (remaining portion) of the channel layer C2 may not be intentionally doped with iron (Fe) as an impurity metal.

The gate insulating layer GI2 may be provided on the substrate SUB2 so as to cover the channel layer C2, the source electrode S2, and the drain electrode D2. The gate electrode G2 may be provided on the gate insulating layer GI2. The gate electrode G2 may be located above the channel layer C2. A passivation layer P2 may be further provided on the gate insulating layer GI2 to cover the gate electrode G2.

The material and thickness of each the substrate SUB2, the source electrode S2, the drain electrode D2, the gate insulating layer GI2, the gate electrode G2, and passivation layer P2 in FIG. 6 may be substantially the same as those of each of the substrate SUB1, the source electrode S1, the drain electrode D1, the gate insulating layer GI1, the gate electrode G1, and the passivation layer P1 in FIG. 1.

Figure 26B:
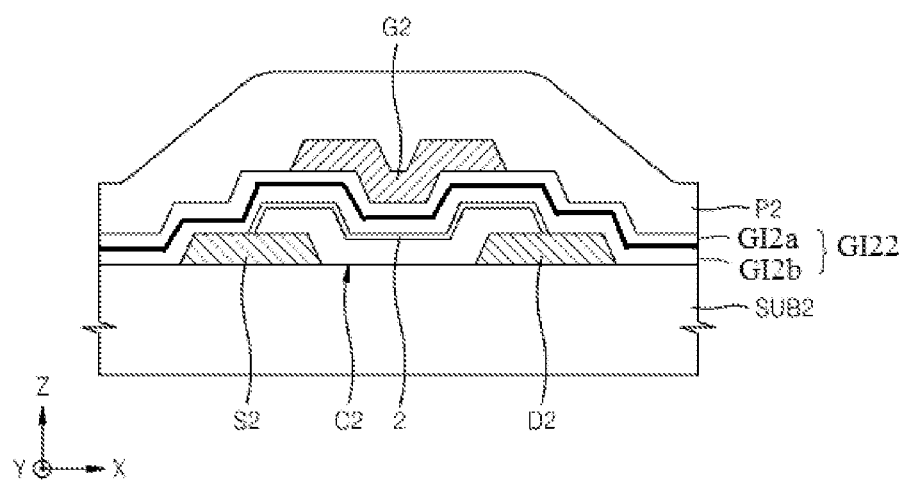

The gate insulating layer GI2 may be a monolayer or a multilayer structure. For example, FIG. 26B illustrates a transistor according to example embodiments that is the same as the transistor in FIG. 6, except the transistor in FIG. 26B includes a gate insulating layer GI22 with a first gate insulating layer GI12a on a second gate insulating layer GI12b. The impurity metal containing region 2 may be formed in a surface portion of the second gate insulating layer GI12b.

Figure 7:
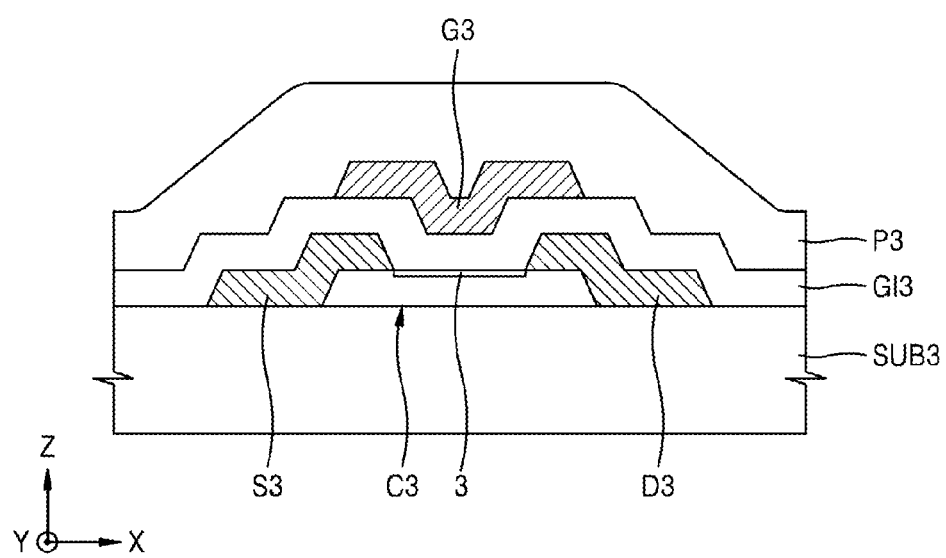
FIG. 7 is a cross-sectional view of a transistor according to example embodiments of inventive concepts.

FIG. 7 is a cross-sectional view of a transistor according to example embodiments of inventive concepts. In FIG. 7, the transistor is another example of the thin film transistor having a top gate structure.

Referring to FIG. 7, a channel layer C3 may be provided on a substrate SUB3. A source electrode S3 and a drain electrode D3 may be provided to contact opposite ends of an upper surface portion of the channel layer C3. The channel layer C3 may include an impurity metal containing region 3 in a surface portion (upper surface portion) thereof. The impurity metal containing region 3 may be a region containing, for example, iron (Fe). The material and characteristics of the impurity metal containing region 3 may substantially the same as or similar to those of the impurity metal containing region 2 in FIG. 6. The material and characteristics of the other region (remaining portion) except for the impurity metal containing region 3 in the channel layer C3 may substantially the same as or similar to those of that in FIG. 6. A gate insulating layer GI3 may be provided on the channel layer C3. A gate electrode G3 may be provided on the gate insulating layer GI3. A passivation layer P3 may be provided on the gate electrode G3.

Although FIG. 7 illustrates that the impurity metal containing region 3 is formed in the upper surface portion of the channel layer C3 between the source electrode S3 and the drain electrode D3, a forming range of the impurity metal containing region 3 may vary. For example, the impurity metal containing region 3 may extend to the whole upper surface portion and the side surfaces of the channel layer C3. In this case, the impurity metal containing region 3 may be present not only on a boundary surface between the channel layer C3 and the gate insulating layer GI3, but also on a boundary surface of the channel layer C3 and the source/drain electrodes S3 and D3.

Example embodiments of inventive concepts may be applied to a thin film transistor having a self-aligned top gate structure, in addition to the structures illustrated in FIGS. 6 and 7. In this case, a gate insulating layer and a gate electrode may be sequentially stacked on a center portion (channel area) of an active layer (semiconductor layer). A source region and a drain region may be provided in the active layer at opposite sides of the gate electrode. An impurity metal containing region containing, for example, iron (Fe), may be provided in a surface portion of the active layer contacting the gate insulating layer. A material composition of the active layer may be substantially the same as or similar to that of the channel layer C2 of FIG. 6. The source region and the drain region may be treated with plasma so as to have a high electric conductivity. The plasma may be plasma of a gas containing, for example, hydrogen (H).

FIGS. 8A to 8D are cross-sectional views illustrating a method of manufacturing a thin film transistor having a top gate structure transistor according to example embodiments of inventive concepts.

Figure 8A:
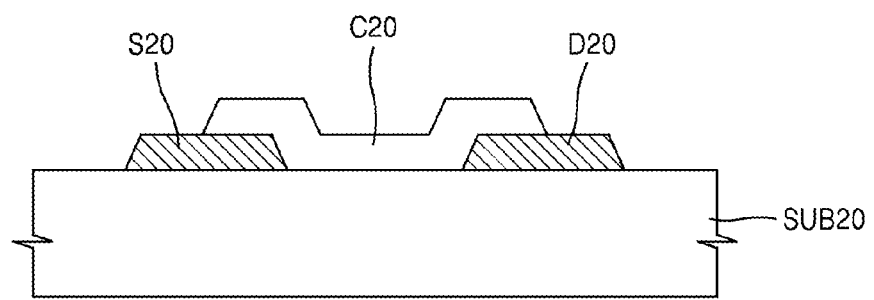
FIGS. 8A to 8D are cross-sectional views illustrating a method of manufacturing a transistor, according to example embodiments of inventive concepts.

Referring to FIG. 8A, a source electrode S20 and a drain electrode D20 may be separately formed on a substrate SUB20. Next, a channel layer C20 may be formed to contact the source electrode S20 and the drain electrode D20. The channel layer C20 may be formed of an inorganic semiconductor. The channel layer C20 may include at least one of an oxide semiconductor, an oxynitride semiconductor, an oxynitride semiconductor containing fluorine, a nitride semiconductor, and a nitride semiconductor containing fluorine. In a detailed example, the channel layer C20 may include at least one of a ZnO-based semiconductor, a SnO-based semiconductor, an InO-based semiconductor, a ZnON-based semiconductor, a ZnONF-based semiconductor, a ZnN-based semiconductor, and a ZnNF-based semiconductor. In this case, the channel layer C20 may further include an additional element X. The additional element X may include at least one of a group I element, a group II element, a group III element, a group IV element, a group V element, a transition metal element, and a lanthanide. In a detailed example, the additional element X may include at least one of Li, K, Mg, Ca, Sr, Ba, Ga, Al, In, B, Si, Sn, Ge, Sb, Y, Ti, Zr, V, Nb, Ta, Sc, Hf, Mo, Mn, Fe, Co, Ni, Cu, W, La, Ce, Pr, Nd, Pm, Sm, Eu, Gd, Tb, Dy, Ho, Er, Tm, Yb, and Lu. Alternatively, the additional element X may include at least one of a group VI element and a group VII element. In a detailed example, the additional element X may include at least one of F, Cl, Br, I, S, and Se. The thickness of the channel layer C20 may be about 10~150 nm, for example, about 20~100 nm. However, a thickness range of the channel layer C20 may vary as occasion demands.

Figure 8B:
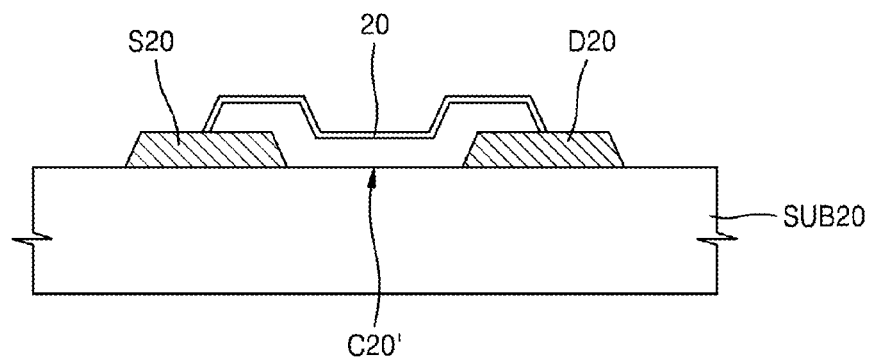

Referring to FIG. 8B, an impurity metal containing region 20 may be formed in/on a surface portion of the channel layer C20. A channel layer where the impurity metal containing region 20 is formed is indicated by C20'. The impurity metal containing region 20 may be a region containing, for example, iron (Fe). A method of forming the impurity metal containing region 20 may be substantially the same as or similar to the method of forming the impurity metal containing region 10 that is described above with reference to FIGS. 3B, 4, and 5. For example, the surface portion of the channel layer C20 may be processed by using a solution containing an impurity metal, thereby forming the impurity metal containing region 20. The solution containing an impurity metal may include, for example, at least one of $FeCl_2$, $FeCl_3$, $Fe(NO_3)_3.9H_2O$, MEA, DGME, EG, AP, TEG, JPS-1300, and PRS-2000. The $FeCl_2$, $FeCl_3$, and $Fe(NO_3)_3.9H_2O$ may be dissolved in water (DI water) to an appropriate concentration, for example, about a few to several hundreds of micromoles, to be used in a solution state. The MEA, DGME, EG, AP, TEG, JPS-1300, and PRS-2000 may be materials in a solution state including an organic solvent. An ultrasonic application process may be performed, if necessary, while the surface portion of the channel layer C20 is processed by using the solution containing an impurity metal. In some cases, the impurity metal containing region 20 may be formed by injecting (ion implanting) impurity metal ions in the surface portion of the channel layer C20, or forming a separate material layer containing an impurity metal on the channel layer C20. The separate material layer may be a semiconductor layer and may correspond to the "impurity metal containing region".

Figure 8C:
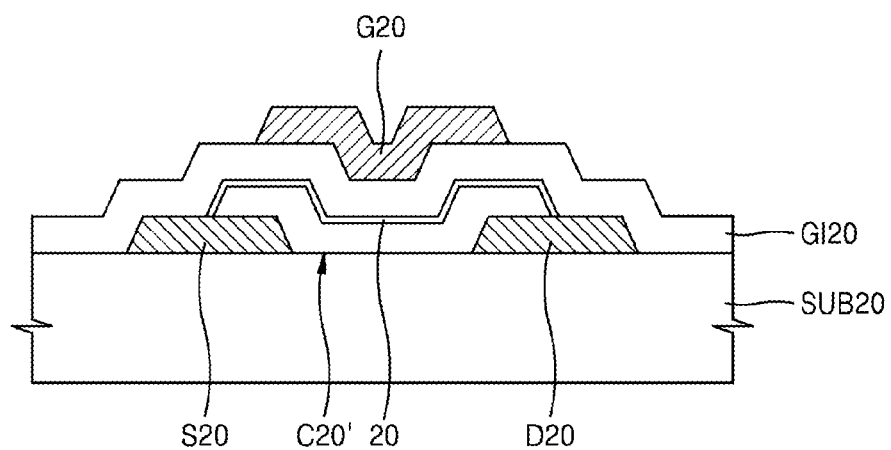

Referring to FIG. 8C, a gate insulating layer GI20 may be formed on the substrate SUB20 to cover the channel layer C20', the source electrode S20, and the drain electrode D20. Next, a gate electrode G20 may be formed on the gate insulating layer GI20.

Figure 8D:
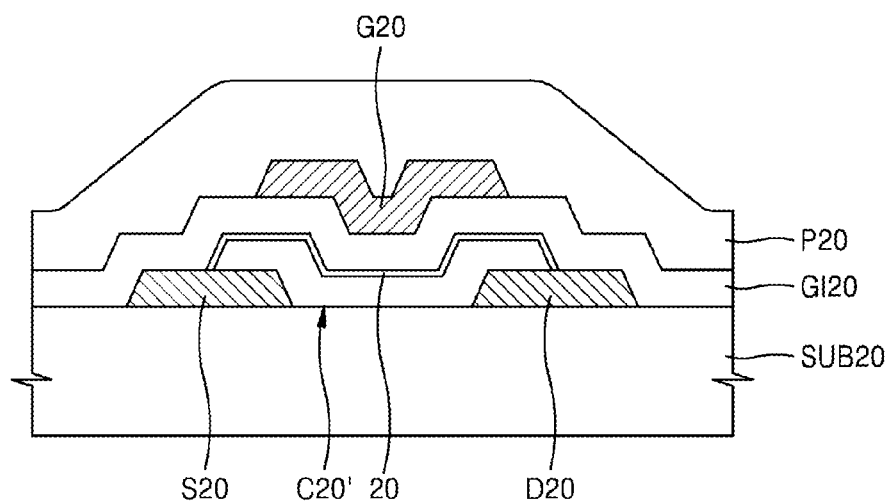

Referring to FIG. 8D, a passivation layer P20 may be formed on the gate insulating layer GI20 to cover the gate electrode G20. A process of annealing (thermal treating) the substrate SUB20 at a desired (and/or alternatively predetermined) temperature to improve device characteristics may be further be performed before or after the passivation layer P20 is formed.

The above-described manufacturing method of FIGS. 8A to 8D is an example of the method of manufacturing the transistor of FIG. 6. The transistor of FIG. 7 may be manufactured by modifying the method. For example, a channel layer may be firstly formed and then a source electrode and a drain electrode may be formed to contact opposite ends of an upper surface portion the channel layer. After the source electrode and the drain electrode are formed, an impurity metal containing region may be formed in the upper surface portion of the channel layer. Alternatively, before the source electrode and the drain electrode are formed, the impurity metal containing region may be formed in the upper surface portion of the channel layer. Next, a gate insulating layer and a gate electrode may be formed on the channel layer. As a result, the transistor of FIG. 7 or a similar structure thereto may be manufactured. In addition, the manufacturing method of FIGS. 8A to 8D may be variously modified.

Figure 9:
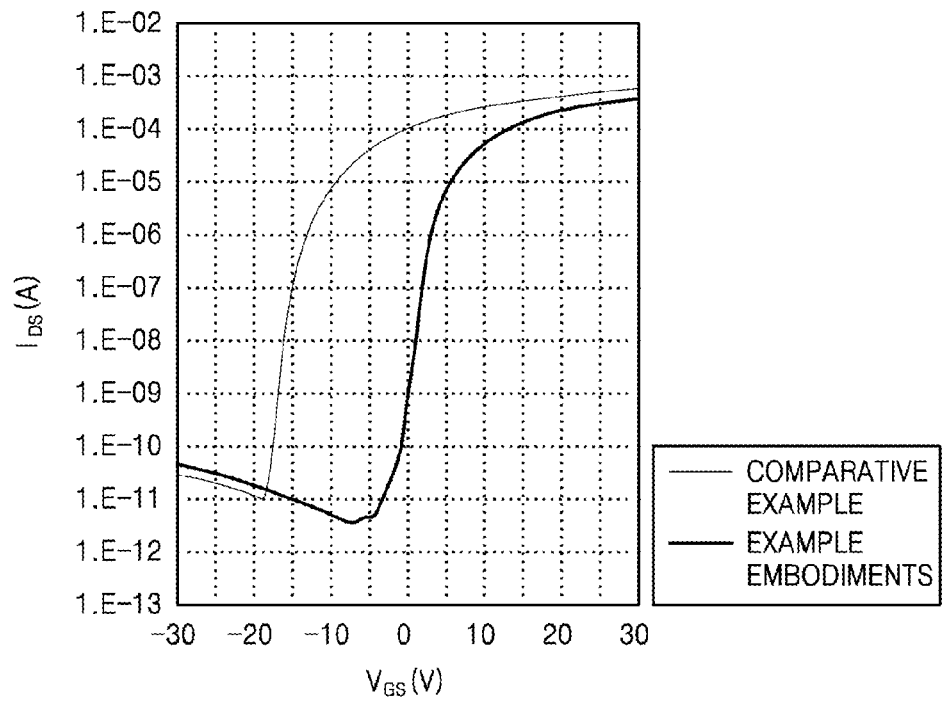
FIG. 9 is a graph showing transfer characteristics of transistors according to example embodiments of inventive concepts and according to a comparative example.

FIG. 9 is a graph showing transfer characteristics of transistors according to example embodiments of inventive concepts and a transistor according to a comparative example. The transistor according to example embodiments has the structure of FIG. 1, whereas the transistor according to the comparative example has a structure in which the gate insulating layer GI1 of FIG. 1 does not include the impurity metal containing region 1. In other words, the transistor according to example embodiments is manufactured by the method of FIGS. 3A to 3F and the transistor according to the comparative example is manufactured by the method of FIGS. 3A to 3F, in which the impurity metal containing region 10 is not formed in the gate insulating layer GI10. The gate insulating layer has a structure in which a SiNx layer having a thickness of about 350 nm and a SiOx layer having a thickness of about 50 nm are sequentially stacked. The channel layer is formed of ZnONF with a thickness of about 50 nm. The gate insulating layer of the transistor according to example embodiments is processed by using JPS-1300 for about 6 minutes and then cleaned by using 2-propanol and DI water for 5 minutes each. FIG. 9 illustrates a result of a difference in the characteristics of a transistor according to whether the gate insulating layer is surface-processed, that is, whether the impurity metal containing region is formed.

Referring to FIG. 9, it may be seen that a graph of the transistor according to example embodiments is far to the right side of a graph of the transistor according to the comparative example, which means that a threshold voltage of the transistor is increased in a positive (+) direction by the impurity metal containing region (1 of FIG. 1). For a transistor using an oxide semiconductor, an oxynitride semiconductor, or an oxynitride semiconductor containing fluorine as a channel material, the threshold voltage may have a high value in a negative (−) direction, that is, a high negative value, and it may not be easy to control the threshold voltage. When the threshold voltage of the transistor has a high value in the negative (−) direction, that is, a high negative value, a voltage of an input signal (absolute value) may increase and thus consumption of power may increase. However, in example embodiments, since the threshold voltage of the transistor is increased in the positive (+) direction by the impurity metal containing region (1 of FIG. 1), the transistor may be easily driven and consumption of power may be lowered.

Figure 10:
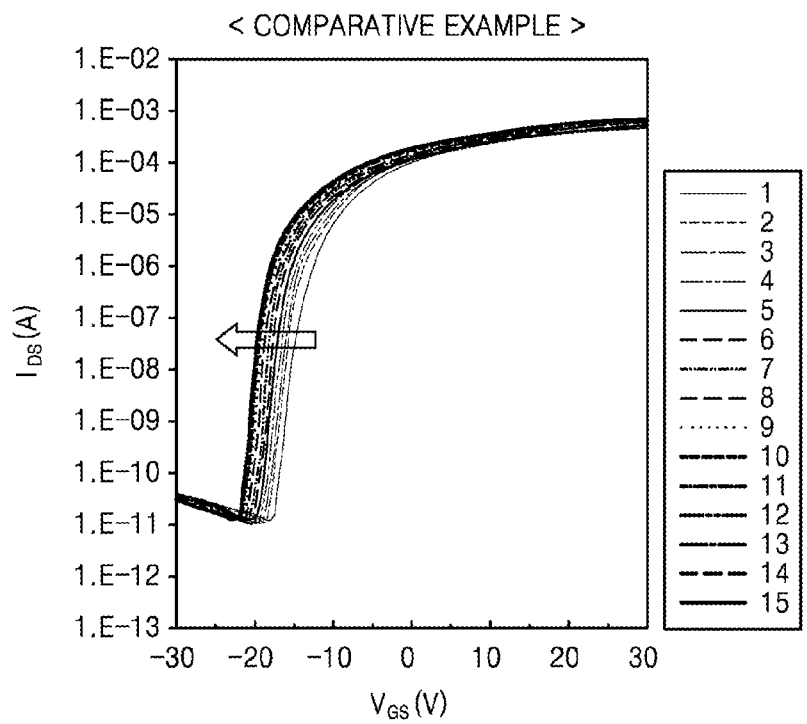
FIG. 10 is a graph showing a change in characteristics according to the passage of time in a transistor according to a comparative example.

FIG. 10 is a graph showing a change in characteristics according to the passage of time in a transistor according to a comparative example. The transistor according to the comparative example is the same as the transistor according to the comparative example of FIG. 9.

Figure 11:
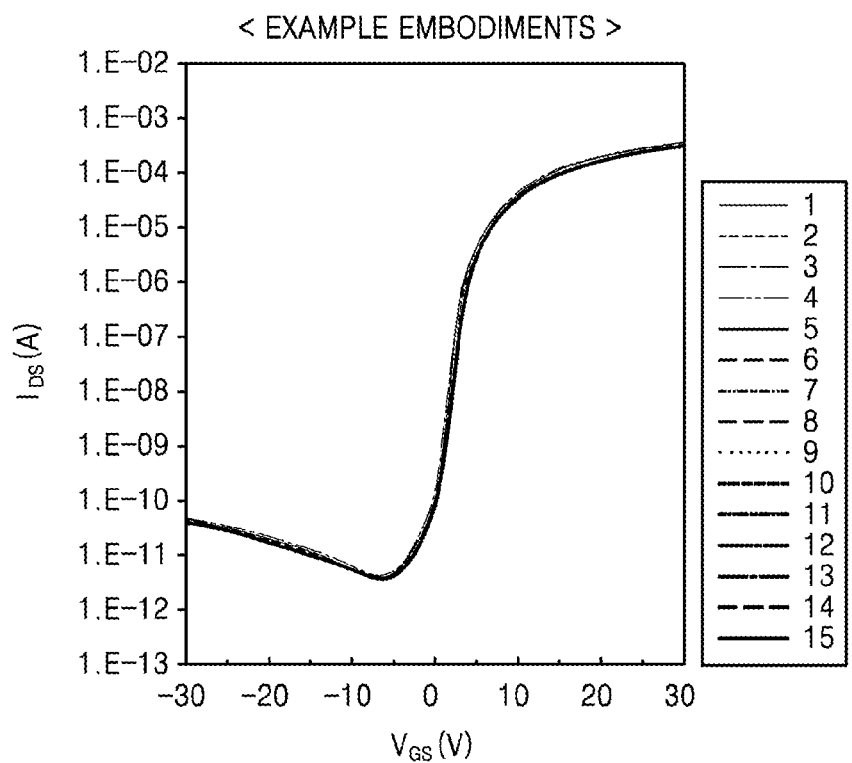
FIG. 11 is a graph showing characteristics of a transistor with the passage of time, according to example embodiments of inventive concepts.

FIG. 11 is a graph showing characteristics of a transistor with the passage of time, according to example embodiments of inventive concepts.

In comparison between FIG. 10 and FIG. 11, it may be seen that a transfer graph of the transistor according to the comparative example moves to the left as the number of measurements increases, which means that the characteristics of the transistor according to the comparative example are considerably changed as time passes. On the other hand, it may be seen that the transfer graph of the transistor according to example embodiments is hardly changed even when the number of measurements increases, which means that the characteristics of the transistor according to example embodiments are hardly changed regardless of the passage of time. It may be seen from the above result that the reliability/stability of the transistor is greatly improved by the impurity metal containing region (1 of FIG. 1).

Figure 12:
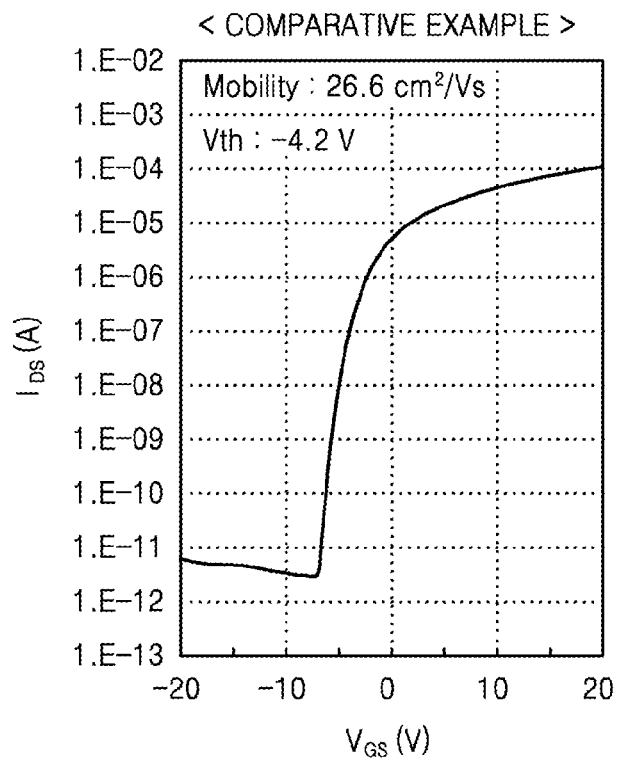
FIGS. 12 to 14 are graphs showing transfer characteristics of transistors according to a comparative example, Embodiment 1, and Embodiment 2.
Figure 13:
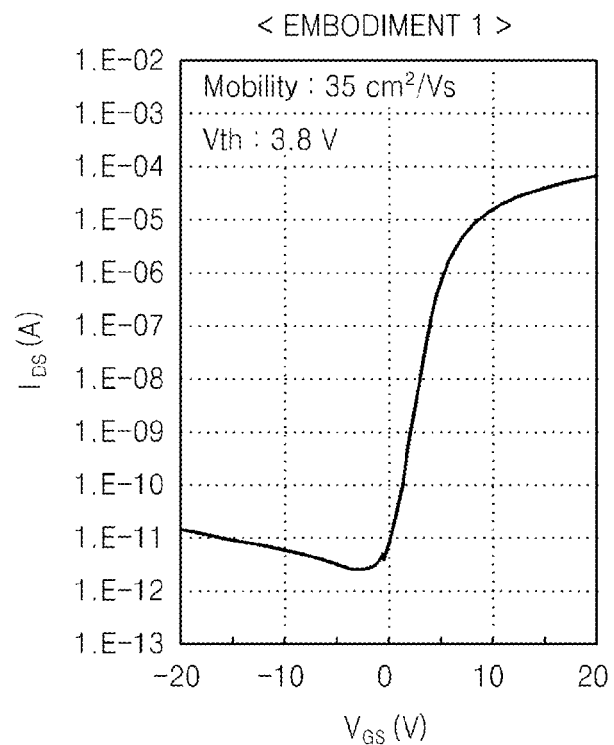
Figure 14:
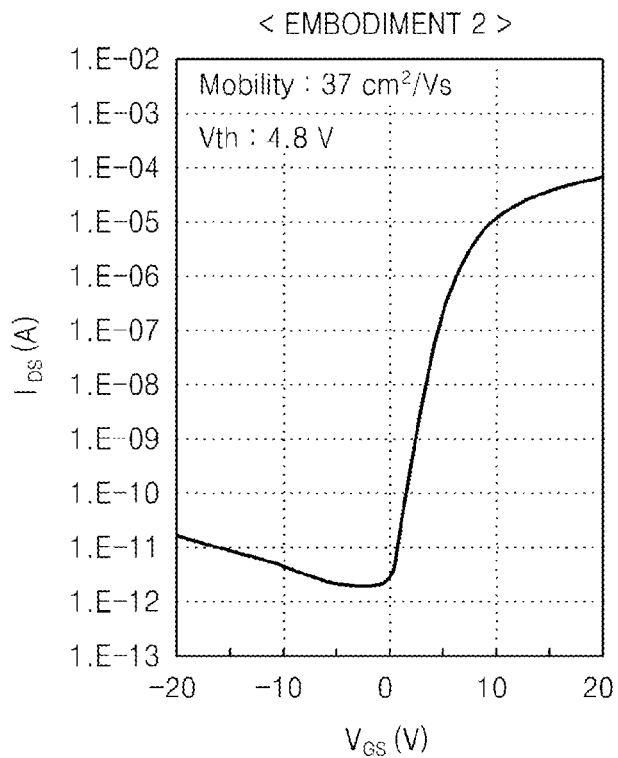

FIGS. 12 to 14 are graphs showing transfer characteristics of transistors according to a comparative example, Embodiment 1, and Embodiment 2, respectively. The transistor according to the comparative example is similar to the transistor according to the comparative example of FIG. 9 but a channel layer is formed of ZnNF with a thickness of about 50 nm. The transistor according to Embodiment 1 includes an impurity metal containing region that is formed by processing a gate insulating layer using JPS-1300. The transistor according to Embodiment 2 includes an impurity metal containing region that is formed by processing the gate insulating layer using a solution containing $FeCl_2$ in which a concentration of $FeCl_2$ is 10 μM in $H_2O$. In Embodiments 1 and 2, a solution process time is about 6 minutes and cleaning is performed by using 2-propanol and DI water for 5 minutes each. Also, in Embodiments 1 and 2, the channel layer is formed of ZnNF with a thickness of about 50 nm, which is the same as the comparative example.

Referring to FIGS. 12 to 14, it may be seen that the graphs of the transistors according to Embodiments 1 and 2 move a lot in a positive (+) direction, compared to the graph of the transistor according to the comparative example, which means that a threshold voltage of the transistor is increased in the positive (+) direction by the impurity metal containing region (e.g., 1 of FIG. 1). Also, it may be seen that the field effect mobility of the transistors according to Embodiments 1 and 2 is higher than that of the comparative example. Accordingly, it may be seen that the basic characteristics of the transistor are controlled and improved by the impurity metal containing region (e.g., 1 of FIG. 1).

Figure 15:
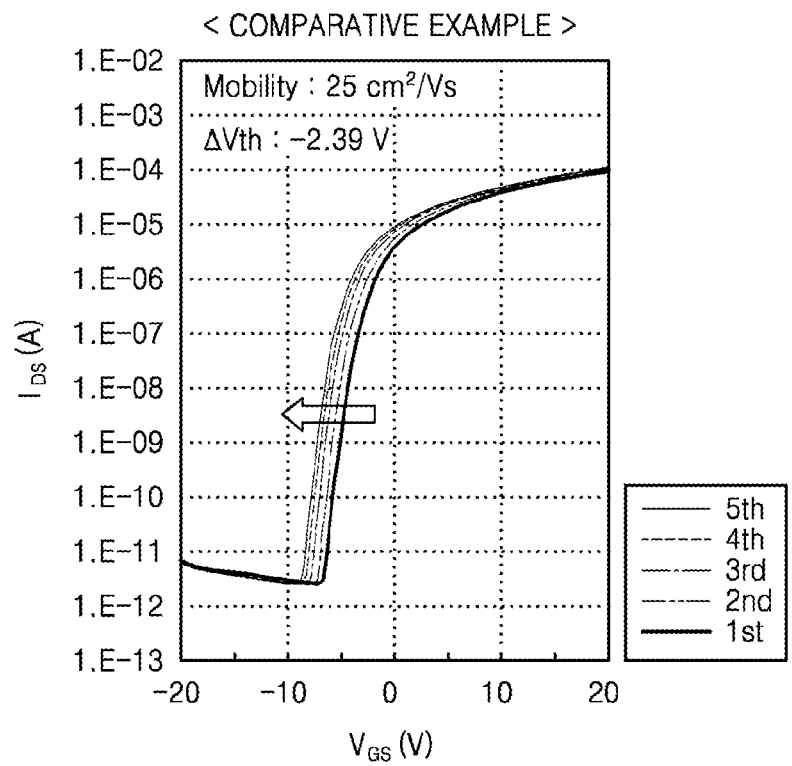
FIGS. 15 to 17 are graphs showing a change in characteristics according to the passage of time in transistors according to a comparative example, Embodiment 1, and Embodiment 2.
Figure 16:
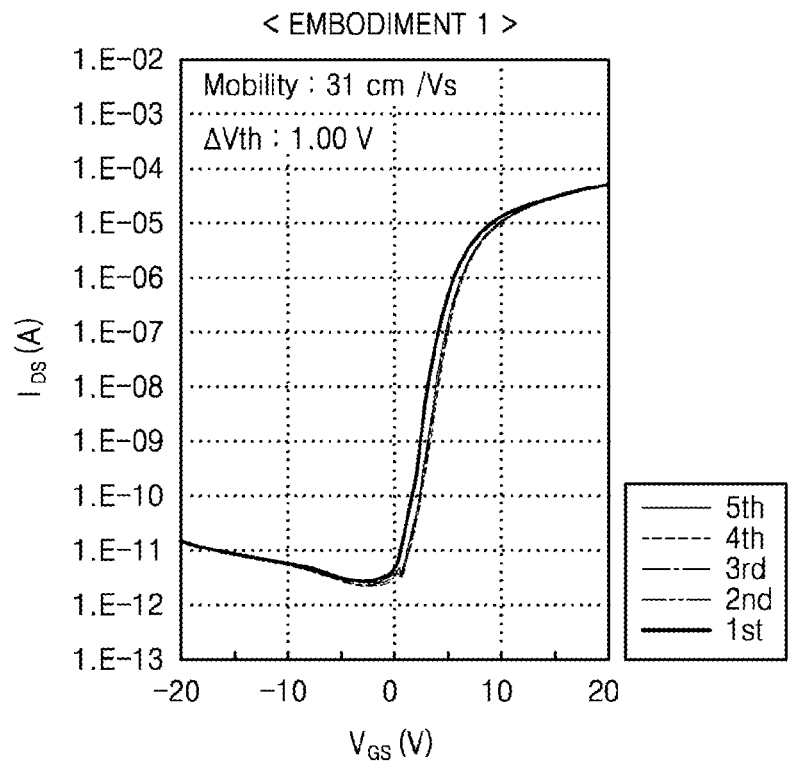
Figure 17:
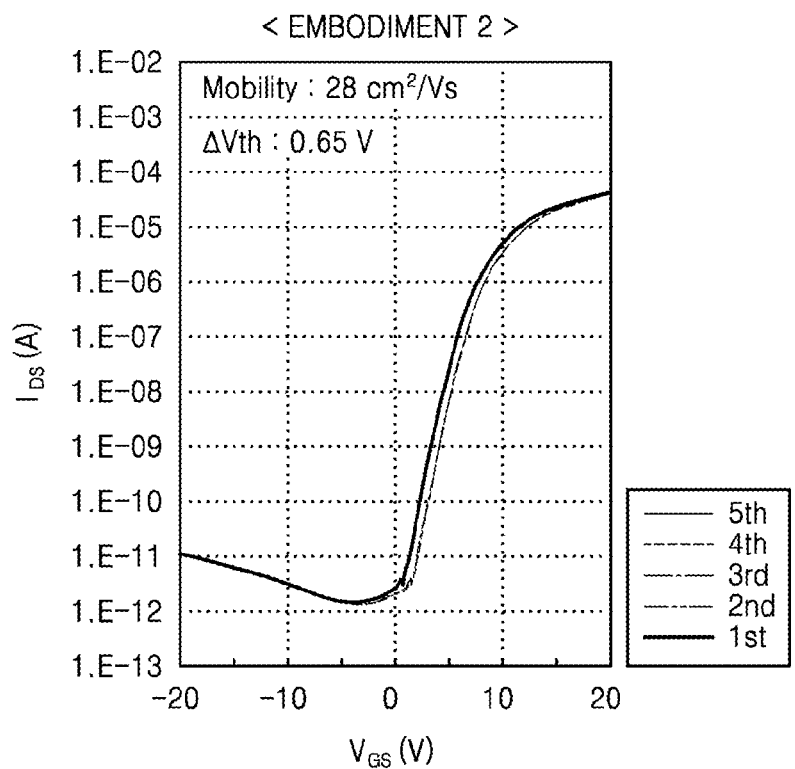

FIGS. 15 to 17 are graphs showing a change in characteristics according to the passage of time in transistors according to a comparative example, Embodiment 1, and Embodiment 2. The transistor according to the comparative example is the same as the transistor according to the comparative example of FIG. 12. The transistor according to Embodiment 1 is the same as the transistor according to Embodiment 1 of FIG. 13. The transistor according to Embodiment 2 is the same as the transistor according to Embodiment 2 of FIG. 14.

Referring to FIGS. 15 to 17, it may be seen that, the characteristics of the transistor according to the comparative example are easily changed according to the passage of time (see FIG. 15), however, the characteristics of the transistors according to Embodiments 1 and 2 are relatively less changed (see FIGS. 16 and 17). Accordingly, according to example embodiments, the reliability/stability of a transistor may be improved.

Figure 18:
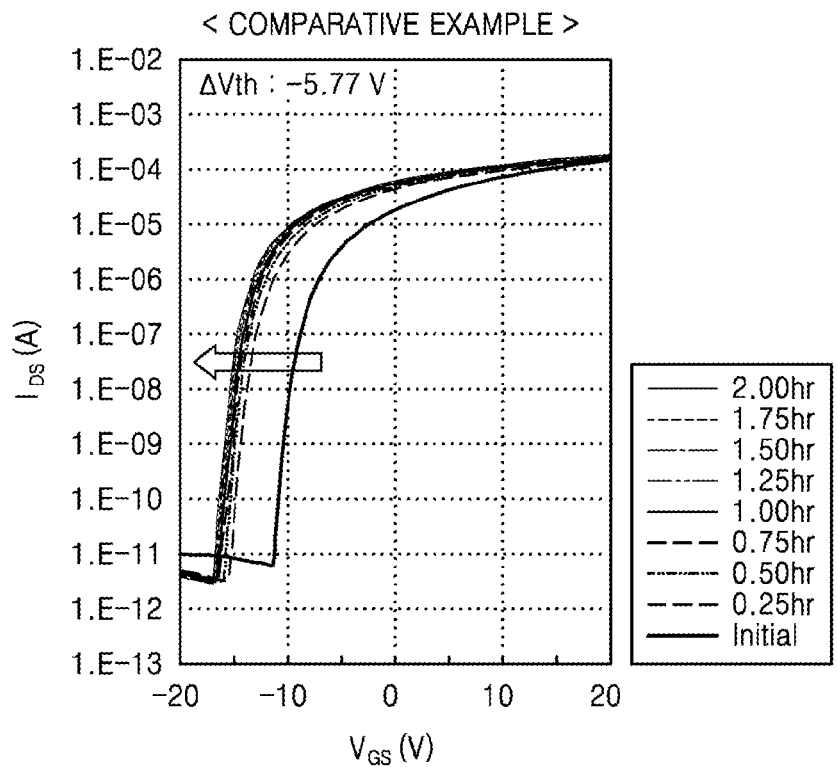
FIG. 18 is a graph showing a change in characteristics of a transistor according to a comparative example due to negative bias temperature stress (NBTS)

FIG. 18 is a graph showing a change in characteristics of a transistor according to a comparative example due to negative bias temperature stress (NBTS). The transistor according to the comparative example of FIG. 18 is the same as the transistor according to the comparative example of FIG. 15. A gate voltage Vg of about −20 V is applied at a temperature of about 100° C., as the NBTS.

Figure 19:
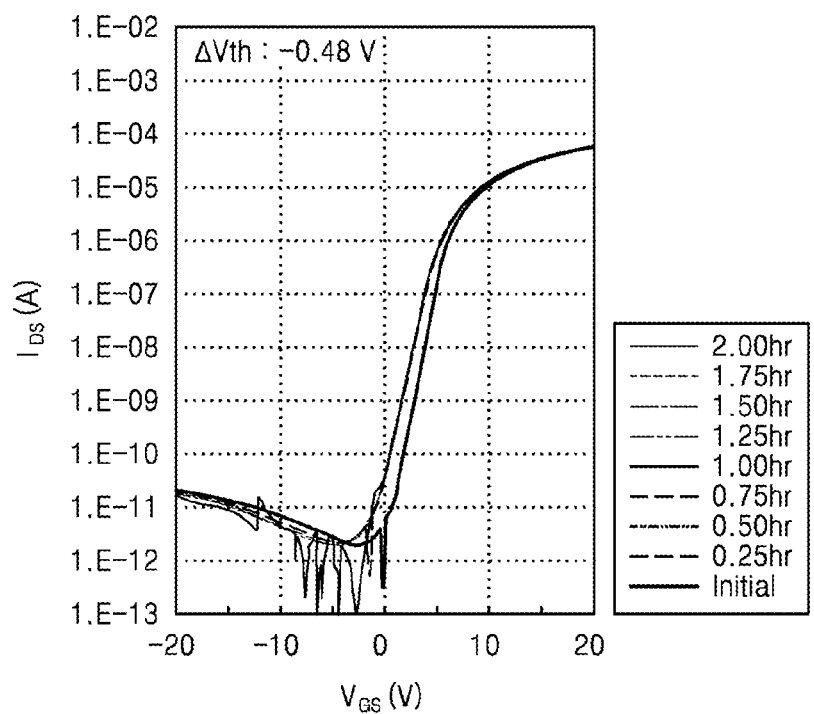
FIG. 19 is a graph showing a change in characteristics of a transistor according to example embodiments of inventive concepts due to NBTS.

FIG. 19 is a graph showing a change in characteristics of transistor according to example embodiments of inventive concepts due to the NBTS. The transistor according to the embodiment of FIG. 19 is the same as the transistor according to Embodiment 1 of FIG. 16. The NBTS conditions are the same as those of FIG. 18.

In comparison between FIG. 18 and FIG. 19, it may be seen that a change in the characteristics of the transistor according to the embodiment of FIG. 19 is remarkably smaller than that in the characteristics of the transistor according to the comparative example of FIG. 18. In detail, after about two (2) hours pass, the amount of a change in the threshold voltage (ΔVth) of the transistor according to the comparative example is −5.77 V, whereas the amount of a change in the threshold voltage (ΔVth) of the transistor according to the embodiment is −0.48 V, which means that, even in a stress state due to NBTS, a change in the characteristics of the transistor according to the embodiment of FIG. 19 is remarkably smaller than that of the transistor according to the comparative example of FIG. 18 so that reliability and stability may be greatly improved.

It may be seen from the results of FIGS. 9 to 19 that, in the transistor according example embodiments of inventive concepts, the impurity metal containing region (e.g., 1 of FIG. 1) increases the threshold voltage in the positive (+) direction, restricts a change in the characteristics of the transistor according to the passage of time, and improves reliability/stability with respect to bias stress. This may be because the impurity metal containing region 1 alters an energy band structure between the gate insulating layer GI1 and the channel layer C1 so as to properly decrease the carrier concentration of the channel layer C1 to an appropriate concentration and increase an energy barrier with respect to a carrier trap, thereby restricting the carrier trap, for example, hole trapping, into the gate insulating layer GI1. Also, the impurity metal containing region 1 may increase a work function of a surface portion of the gate insulating layer GI1 and form a surface dipole layer, thereby obtaining the above-described various effects. In other words, as the impurity metal containing region 1 functions as a surface dipole layer, the surface potential of the gate insulating layer GI1 may be increased, the carrier concentration of the channel layer C1 may be appropriately decreased, and the threshold voltage may be increased in the positive (+) direction. Also, the carrier trap, for example, hole trapping, into the gate insulating layer GI1 may be restricted by the effect of a barrier increase due to a dipole moment, thereby improving the reliability with respect to the NBTS. Also, at least some of the above-described effects may be obtained by the impurity metal doping region, for example, an Fe-doped region (not shown), provided in the boundary portion of the channel layer C1 contacting the gate insulating layer GI1. However, the above-described mechanism/principles are exemplary and the above-described various effects may be obtained for other reasons. Also, although the above-described mechanism/principles are described mainly with respect to the structure of FIG. 1, the above-described mechanism/principles may be applied to the structures of transistors according to other embodiments.

Table 1 shows a result of a secondary ion mass spectrometry (SIMS) analysis for measuring content of iron (Fe) of a surface portion of a gate insulating layer according to a type of a surface treatment agent when a surface of the gate insulating layer is processed with a variety of surface treatment agents. In other words, after a $SiO_2$ layer included in the gate insulating layer is processed with a variety of surface treatment agents, SIMS analysis is performed on the surface-processed $SiO_2$ layer. The Fe content is an amount relative to other components and a unit thereof is arbitrary unit (a.u.).

TABLE 1

| Surface treatment agent | Fe content (a.u.) |
| --- | --- |
| No treatment | 0.00 |
| NMP | 0.00 |
| $FeCl_2$ solution (30 μM in $H_2O$) | 1.72 |
| $FeCl_3$ solution (30 μM in $H_2O$) | 2.60 |
| ME A | 0.75 |
| DGME | 0.06 |
| JPS-1300 | 0.42 |

Referring to Table 1, for the cases of "No treatment" that is not surface-processed or NMP treatment that is not effective, Fe is not detected. When $FeCl_2$ solution, $FeCl_3$ solution, MEA, DGME, or JPS-1300 which are effective is used, Fe is detected. The chemical name of NMP is N-methylpyrrolidone. The chemical names or the material compositions of MEA, DGME, and JPS-1300 are the same as those described above.

Table 2 shows a result of an inductively coupled plasma-mass spectrometry (ICP-MS) analysis on the contents of respective components of a surface treatment agent. Table 2 shows the contents of Fe of various surface treatment agents. The unit of Fe content is parts per billion (ppb). "ND" in Table 2 denotes that the corresponding component (e.g., Fe content) is not detected.

TABLE 2

| Classification | NMP | EG | MEA | JPS-1300 |
|---|---|---|---|---|
| Al | 2.7 | 2.4 | 7.6 | ND |
| Ca | ND | 5.1 | ND | ND |
| Cd | ND | ND | ND | ND |
| Co | ND | ND | ND | ND |
| Cr | ND | 2.3 | 3.7 | 2.3 |
| Cu | ND | ND | 18.2 | ND |
| Fe | ND | 86.7 | 8276.6 | 450.2 |
| K | 1.0 | 13.7 | 2.1 | 1.6 |
| Li | ND | ND | ND | ND |
| Mg | 2.1 | 385.7 | 9.9 | 5.4 |
| Mn | ND | 22.7 | 125.1 | 2.6 |
| Na | 31.1 | 1092.7 | 522.3 | 102.6 |
| Ni | ND | 3.5 | 3.2 | 1.6 |
| Pd | 2.6 | ND | 2.4 | 1.7 |
| Zn | ND | 49.1 | 1093.8 | 58.0 |

Referring to Table 2, for NMP that is not effective, Fe is not detected. For EG, MEA, and JPS-1300 which are effective for Example embodiments of inventive concepts, a considerable amount of the Fe component is detected. It may be seen from the above result that the Fe content of a surface treatment agent that may have an effect may be several parts per billion (ppb) to several parts per million (ppm).

It may be seen from the results of Tables 1 and 2 that the various effects according to example embodiments may be obtained as a metal component such as Fe of the surface treatment agent is added to a surface of the gate insulating layer.

Table 3 shows a change in the work function of the surface portion of the gate insulating layer before/after the surface treatment of the gate insulating layer. In other words, Table 3 shows work functions that are measured before/after the $SiO_2$ layer of the gate insulating layer is processed with a surface treatment agent containing an iron (Fe) component. Ultraviolet photoelectron spectroscopy (UPS) is used for the measurement of a work function. Here, as an ultraviolet (UV) source, $He_2$ of about 40.8 eV is used.

TABLE 3

| Sample | Work Function (eV) |
|---|---|
| Sample 1 before surface treatment | 3.255 |
| Sample 2 before surface treatment | 3.334 |
| Sample 1 after surface treatment | 4.732 |
| Sample 2 after surface treatment | 4.802 |

Referring to Table 3, it may be seen that a work function is increased by about 1.5 eV by the surface treatment. The work function of the surface portion of the gate insulating layer may be increased by the impurity metal containing region. Accordingly, the impurity metal containing region may function as a surface dipole layer.

Figure 20:
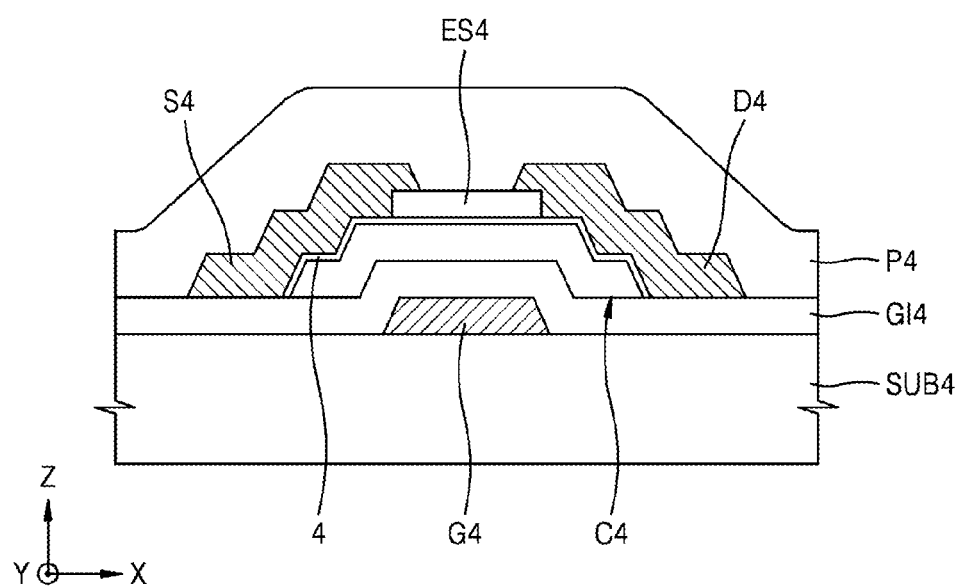
FIG. 20 is a cross-sectional view of a transistor according to example embodiments of inventive concepts.

FIG. 20 is a cross-sectional view of a transistor according to example embodiments of inventive concepts. The transistor in FIG. 20 may obtained by altering the structure of the transistor of FIG. 1. In other words, while the impurity metal containing region 1 is not provided in the upper surface portion of the gate insulating layer GI1 in the structure of FIG. 1, an impurity metal containing region is provided in an upper surface portion of a channel layer C4 in FIG. 20.

Referring to FIG. 20, a gate electrode G4 and a gate insulating layer GI4 may be provided on a substrate SUB4, wherein the gate insulating layer GI4 may cover the gate electrode G4. The channel layer C4 may be provided on the gate insulating layer GI4 above the gate electrode G4. The channel layer C4 may include an impurity metal containing region 4 in an upper surface portion (upper surface portion) thereof. An etch stop layer ES4 may be provided on the channel layer C4. A source electrode S4 and a drain electrode D4 may be provided contacting two different region of the channel layer C4. A passivation layer P4 may be provided on the gate insulating layer GI4 to cover the source electrode S4, the drain electrode D4, and the etch stop layer ES4.

The gate insulating layer GI4 may be substantially the same as or similar to the gate insulating layer GI1 of FIG. 1, except that an impurity metal containing region is not included in an upper surface portion of the gate insulating layer GI4. The materials and characteristics of the channel layer C4 and the impurity metal containing region 4 may be substantially the same as or similar to those of the channel layer C2 and the impurity metal containing region 2 of FIG. 6. Accordingly, the impurity metal containing region 4 may be a region containing, for example, iron (Fe). Also, the impurity metal containing region 4 may be formed by processing the upper surface portion of the channel layer C4 by using a solution containing a metal element (e.g., Fe) such as a solution including at least one of $FeCl_2$, $FeCl_3$, $Fe(NO_3)_3 \cdot 9H_2O$, MEA, DGME, EG, AP, TEG, JPS-1300, and PRS-2000, for example.

The structure of FIG. 20 may be manufactured by using a method obtained by slightly modifying the manufacturing method that is described with reference to FIGS. 3A to 3F and FIGS. 8A to 8D. Such modification may be obvious to those of ordinary skill in the art, and thus, a detailed description thereof is omitted. The etch stop layer ES4 may not be provided in the structure of FIG. 20 and other various changes may be possible.

Figure 21:
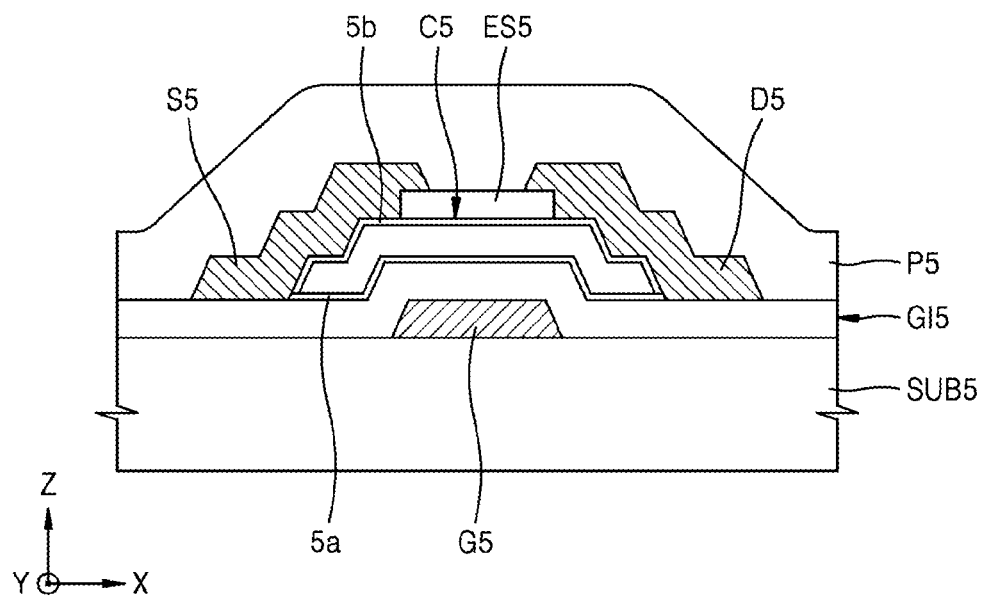
FIG. 21 is a cross-sectional view of a transistor according to example embodiments of inventive concepts.

FIG. 21 is a cross-sectional view of a transistor according to example embodiments of inventive concepts. The transistor in FIG. 21 may be obtained by altering the structure of FIG. 20. In other words, FIG. 21 illustrates a case in which an impurity metal containing region is additionally provided in the upper surface portion of the gate insulating layer GI4 in the structure of FIG. 20.

Referring to FIG. 21, a gate insulating layer GI5 may include a first impurity metal containing region 5a that is provided in a surface portion (upper surface portion) thereof. A channel layer C5 may include a second impurity metal containing region 5b that is provided in a surface portion (upper surface portion) thereof. The materials and characteristics of the gate insulating layer GI5 and the first impurity metal containing region 5a may be substantially the same as or similar to those of the gate insulating layer GI1 and the impurity metal containing region 1 of FIG. 1. The material and characteristics of the channel layer C5 and the second impurity metal containing region 5b may be substantially the same as or similar to those of the channel layer C4 and the impurity metal containing region 4 of FIG. 20. The first impurity metal containing region 5a may have an insulation characteristic, and the second impurity metal containing region 5b may have a semiconductor characteristic. Reference numerals such as SUB5, G5, ES5, S5, D5, and P5 in FIG. 21 denote a substrate, a gate electrode, an etch stop layer, a source electrode, a drain electrode, and a passivation layer, respectively, which may be substantially the same as or similar to the substrate SUB1, the gate electrode G1, the etch stop layer ES1, the source electrode S1, the drain electrode D1, and the passivation layer P1 of FIG. 1.

As illustrated in FIG. 21, when the first impurity metal containing region 5a of the gate insulating layer G15 and the second impurity metal containing region 5b of the channel layer C5 are both provided, a more improved (reinforced) effect may be obtained due to the metal containing regions.

The structures of FIGS. 20 and 21 may be variously changed. For example, in the structure of FIG. 21, an additional gate (top gate) may be further provided above the channel layer C5, an example of which is illustrated in FIG. 22.

Figure 22:
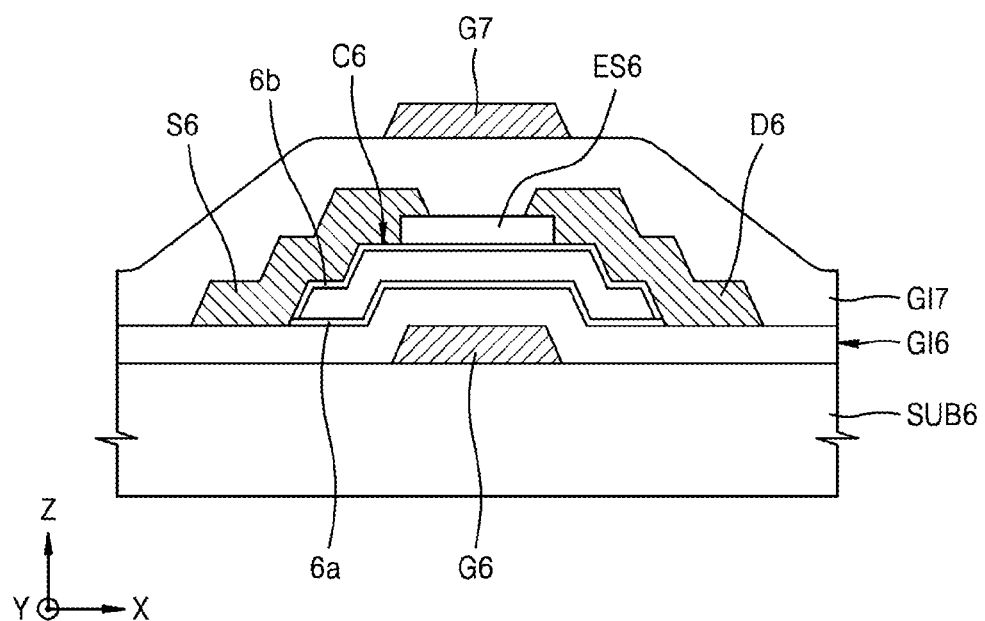
FIG. 22 is a cross-sectional view of a transistor according to example embodiments of inventive concepts.

Referring to FIG. 22, a first gate electrode G6 and a first gate insulating layer G16 may be provided on a substrate SUB6, wherein the first gate insulating layer G16 may cover the first gate electrode G6. The first gate insulating layer G16 may include a first impurity metal containing region 6a that is provided in a surface portion (upper surface portion) thereof. A channel layer C6 may be provided on the first gate insulating layer G16. The channel layer C6 may include a second impurity metal containing region 6b that is provided in a surface portion (upper surface portion) thereof. An etch stop layer ES6 and source/drain electrodes S6 and D6 may be provided on the channel layer C6. The substrate SUB6, the first gate electrode G6, the first gate insulating layer G16, the first impurity metal containing region 6a, the channel layer C6, the second impurity metal containing region 6b, etch stop layer ES6, and the source/drain electrodes S6 and D6 may be substantially the same as or similar to those of FIG. 21.

Figure 25:
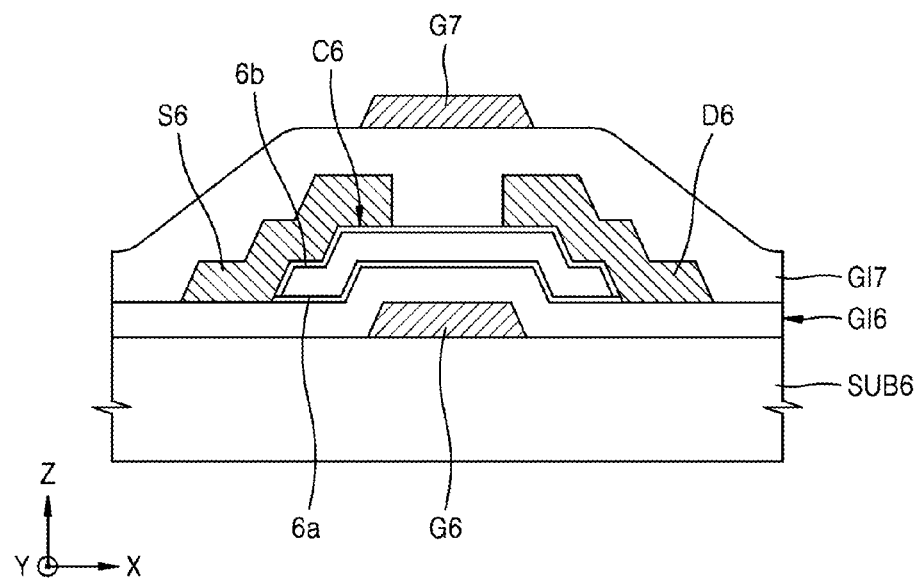
FIG. 25 is a cross-sectional view of a transistor according to example embodiments of inventive concepts.

Additionally, a second gate insulating layer G17 may be provided to cover the etch stop layer ES6 and the source/drain electrodes S6 and D6. A second gate electrode G7 may be provided on the second gate insulating layer G17. Although it is not illustrated, a passivation layer may be further provided on the second gate insulating layer GI7 to cover the second gate electrode G7. The etch stop layer ES6 may not be provided and other various modified structures may be possible. For example, FIG. 25 illustrates a transistor according to example embodiments that is the same as the transistor shown in FIG. 22, except the etch stop layer ES6 is omitted.

When a double gate structure as in FIG. 22 is used, since one channel layer C6 may be controlled by using the two gate electrodes, namely, the first and second gate electrodes G6 and G7, the characteristics of a transistor may be easily controlled and the performance of a transistor may be improved.

Table 4 below shows the structure and formation conditions of sample transistors according to example embodiments.

TABLE 4

| | Corresponding Structure | Gate Insulating Layer Processing Solution | Channel Layer Processing Solution |
|---|---|---|---|
| Sample #1 | FIG. 21 | JPS-1300 | DGME |
| Sample #2 | FIG. 21 | JPS-1300 | AP |
| Sample #3 | FIG. 21 | JPS-1300 | TEG |
| Sample #4 | FIG. 21 | JPS-1300 | $FeCl_2$ |
| Sample #5 | FIG. 1 | JPS-1300 | — |

Gate insulating layers of transistor samples #1~#5 of Table 4 have a structure in which a SiNx layer having a thickness of about 350 nm and a SiOx layer having a thickness of about 50 nm are sequentially stacked, and a channel layer is formed of ZnONF with a thickness of about 35 nm. Surfaces of gate insulating layers of all transistor samples #1~#5 are processed by using JPS-1300 for about 6 minutes. The surface of the channel layer of the transistor sample #1 is processed by using DGME. The surface of the channel layer of the transistor sample #2 is processed by using AP. The surface of the channel layer of the transistor sample #3 is processed by using TEG. The surface of the channel layer of the transistor sample #4 is processed by using a $FeCl_2$ solution at a concentration of about 30 μM. When the surfaces of the channel layers of the transistor samples #1 to #3 are processed by using the corresponding solutions, an ultrasonic application process is simultaneously performed.

Figure 23:
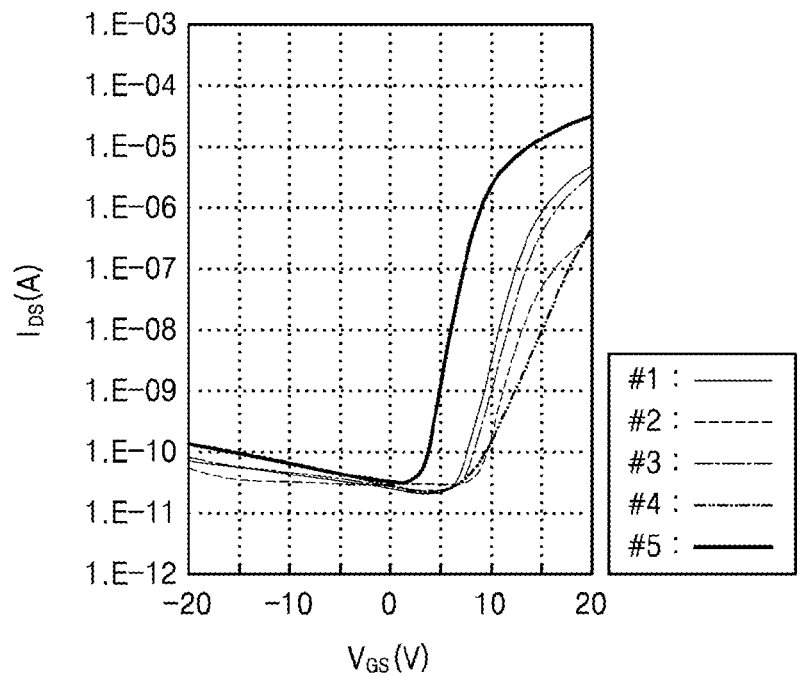
FIG. 23 is a graph showing transfer characteristics of transistor samples according to example embodiments.

FIG. 23 is a graph showing transfer characteristics of sample transistors according to example embodiments.

Referring to FIG. 23, it may be seen that the curves of samples corresponding to the structure of FIG. 21, that is, samples #1~#4, are at the right side of a curve of sample #5 corresponding to the structure of FIG. 1. From this, when the first and second impurity containing areas 5a and 5b are provided as in the structure of FIG. 21, a threshold voltage of a transistor may move more farther in a positive (+) direction, compared to a case in which only one impurity containing area 1 is provided as in the structure of FIG. 1.

Table 5 below shows threshold voltages (Vth) and OFF-currents (Ioff) of various transistor samples of Table 4 (FIG. 23). The OFF-current Ioff denotes a current between the source electrode and the drain electrode when a gate voltage is −5 V.

TABLE 5

| | Threshold Voltage (Vth) [V] | OFF-current (Ioff) [A] |
|---|---|---|
| Sample #1 | 11.61 | 2.16E-11 |
| Sample #2 | 13.27 | 2.65E-11 |
| Sample #3 | 12.89 | 2.11E-11 |
| Sample #4 | 15.99 | 2.25E-11 |
| Sample #5 | 7.03 | 3.21E-11 |

Referring to Table 5, it may be seen that the threshold voltages of samples #1~#4 are about 1.5 to 2 times greater than the threshold voltage Vth of sample #5. Also, the OFF-currents Ioff of samples #1~#4 are lower than the OFF-current Ioff of sample #5. It may be seen from the above result that the characteristics of a transistor may be controlled and improved by doping impurity metal through a solution processing of a surface portion of the channel layer as in the structure of FIG. 21.

The transistor according example embodiments of inventive concepts may be applied to a display apparatus such as an organic light-emitting apparatus or a liquid crystal display apparatus, as a switching device or a driving device. As described above, since the transistor according example embodiments of inventive concepts has a high mobility, excellent switching characteristics, a controlled threshold voltage, and high reliability/stability, the performance of a display apparatus may be improved when the transistor is applied to the display apparatus. Accordingly, a transistor according example embodiments of inventive concepts may be applied to implement a next generation high performance/high resolution/large-size display apparatus. Also, the transistor according example embodiments of inventive concepts may be variously used in not only displays but also in the fields of other electronic devices such as memory devices and logical devices.

Figure 24:
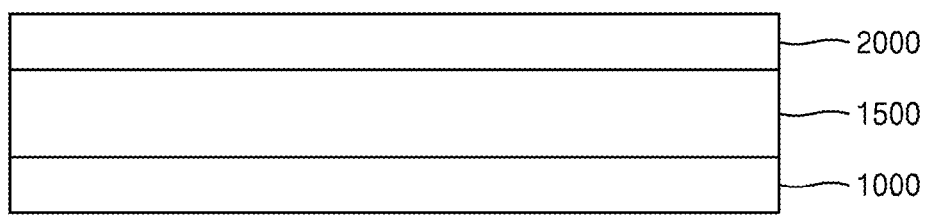
FIG. 24 is a cross-sectional view illustrating an example of an electronic device including a transistor according to example embodiments of inventive concepts.

FIG. 24 is a cross-sectional view illustrating an example of an electronic device including a transistor according to example embodiments of inventive concepts. In example embodiments, the electronic device may be a display apparatus.

Referring to FIG. 24, a desired (and/or alternatively predetermined) intermediate layer 1500 may be provided between a first substrate 1000 and a second substrate 2000. The first substrate 1000 may be an array substrate including the transistor according example embodiments of inventive concepts, for example, at least one of the transistors described with reference to FIGS. 1, 2, 6, 7, and 20 to 22, as a switching device or a driving device. The second substrate 2000 may be a substrate facing the first substrate 1000. The configuration of the intermediate layer 1500 may vary according to a type of a display apparatus. In example embodiments, when the display apparatus is an organic light-emitting display apparatus, the intermediate layer 1500 may include an "organic light-emitting layer". On the other hand, in example embodiments, when the display apparatus is a liquid crystal display apparatus, the intermediate layer 1500 may include a "liquid crystal layer". Also, for a liquid crystal display apparatus, a backlight unit (not shown) may be further provided under the first substrate 1000. Example embodiments are not limited to the configuration of an electronic device including the transistor according to the structure of FIG. 24, and may be variously altered.

Figure 27A:
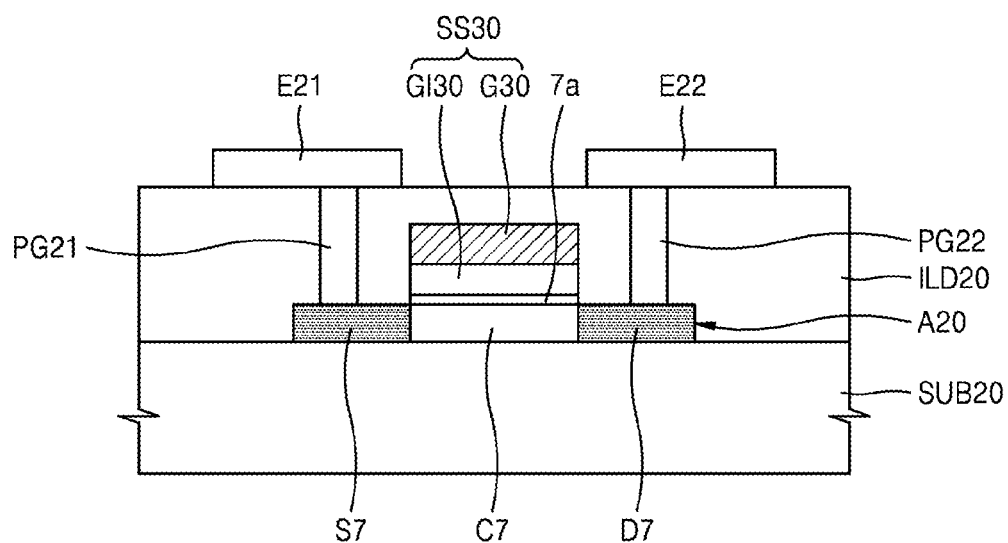
FIGS. 27A and 27B are cross-sectional views of transistors according to example embodiments of inventive concepts.
Figure 27B:
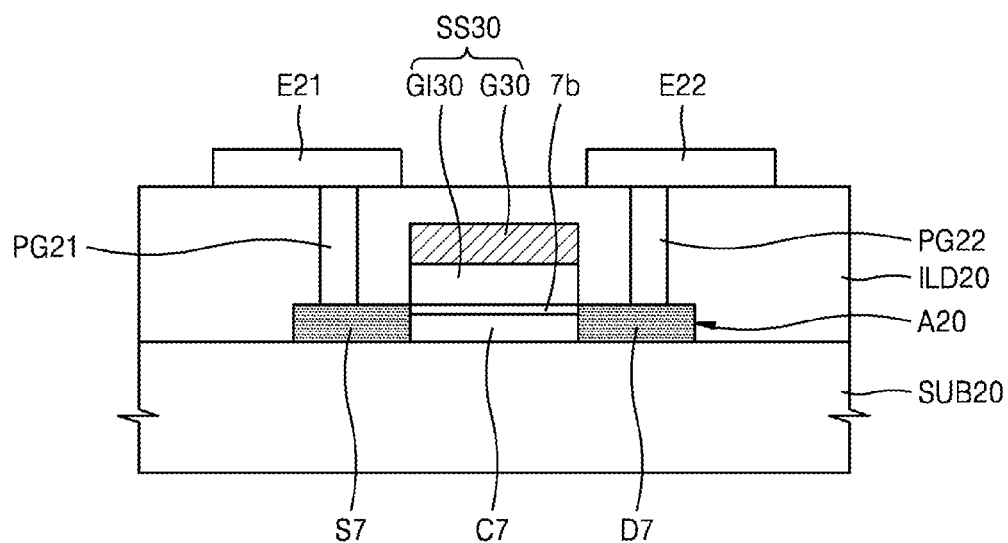

FIGS. 27A and 27B are cross-sectional views of transistors according to example embodiments of inventive concepts.

Referring to FIG. 27A, an active layer A20 may be disposed on a substrate SUB20. The substrate SUB20 may be a glass substrate, or any one of various substrates used in a common semiconductor device process such as a plastic substrate or a silicon substrate. The substrate SUB20 may be an inorganic substrate or an organic substrate, and may be transparent, opaque, or semitransparent. The active layer A20 may have a channel layer C7 at or around a central portion thereof. A material, properties, characteristics, and modifications of the channel layer C7 may be the same as the channel layer 1 described previously with regard to FIG. 1.

A stacked structure SS30 in which a gate insulating layer GI30 and a gate electrode G30 are sequentially stacked may be disposed on the channel layer C7 of the active layer A20. A source electrode S7 and a drain electrode D7 may be disposed on the substrate SUB20 to contact sides of the channel layer C7. A material, properties, characteristics, and modifications of the source, drain, and gate electrodes S7, D7, and G30 may be the same as the source, drain, and gate electrodes S1, D1, and G1 described previously with regard to FIG. 1.

An interlayer insulating layer ILD20 that covers the gate electrode G30, and the source and drain electrodes S7 and D7 be disposed on the substrate SUB20. First and second electrodes E21 and E22 that are electrically connected to the source and drain electrodes S7 and D7 may be disposed on the interlayer insulating layer ILD20. The source electrode S7 and the first electrode E21 may be connected to each other through a conductive plug PG21, and the drain electrode D7 and the second electrode E22 may be connected to each other through a second conductive plug PG22. The first and second electrodes E21 and E22 may be respectively referred to as a source pad and a drain pad. A passivation layer (not shown) that covers the first and second electrodes E21 and E22 may be further disposed on the interlayer insulating layer ILD20.

A material, properties, characteristics, and modifications of the gate insulating layer GI30 may be the same as the gate insulating layer GI1 described previously with regard to FIG. 1 and/or the gate insulating layer GI11 described previously with regard to FIG. 26A. For example, an impurity metal containing region 7a may be formed in a surface portion of the gate insulating layer GI30 at an interface between the gate insulating layer GI30 and the channel layer 7. A material, properties, characteristics, and modifications of the impurity metal containing region 7a may be the same as the impurity metal containing region 1 described previously with regard to FIG. 1.

Referring to FIG. 27B, according to example embodiments, a transistor may be the same as the transistor in FIG. 27A, except an impurity metal containing region 7b may alternatively be formed in a surface portion of the channel layer 7 instead of the gate insulating layer G130. A material, properties, characteristics, and modifications of the impurity metal containing region 7b may be the same as the impurity metal containing region 3 described previously with regard to FIG. 7.

Although some example embodiments are described in detail in the above description, example embodiments are not limited to the above-discussed embodiments. Those of ordinary skill in the art would appreciate that the constituent elements and structure of the above-described transistors according to example embodiments may be variously altered. For example, although in the above description the impurity metal containing region is formed in the gate insulating layer and/or the channel layer, the impurity metal containing region may be formed in an electrode/conductor (e.g., metal and so on). Also, the channel layer may have a multilayer structure having two or more layers and the transistor may have a double gate structure. The manufacturing method of FIGS. 3A to 3F, 4, 5, and 8A to 8D may be variously altered. Also, transistors according to example embodiments may be applied to various electronic devices in addition to the display apparatus of FIG. 24 for many purposes.

It should be understood that example embodiments described herein should be considered in a descriptive sense only and not for purposes of limitation. Descriptions of features or aspects within each device or method according to example embodiments should typically be considered as available for other similar features or aspects in other devices or methods according to example embodiments. While some example embodiments have been particularly shown and described, it will be understood by one of ordinary skill in the art that variations in form and detail may be made therein without departing from the spirit and scope of the claims.

What is claimed is:

1. A transistor comprising:
   a gate;
   a channel layer that is separate from the gate;
   a gate insulating layer between the gate and the channel layer,
   the gate insulating layer including an impurity metal containing region that includes an impurity metal and contacts the channel layer,
   the gate insulating layer including an impurity metal non-containing region that contacts the gate and is not doped with the impurity metal; and
   a source electrode and a drain electrode respectively contacting a first region and a second region of the channel layer, wherein at least a portion of the impurity metal containing region is between the impurity metal non-containing region and a portion of the channel layer between the source electrode and the drain electrode, the portion of the channel layer not overlapping the source electrode and the drain electrode.

2. The transistor of claim 1, wherein the impurity metal containing region includes iron (Fe) as the impurity metal.

3. The transistor of claim 1, wherein
the impurity metal containing region is in a surface portion of the gate insulating layer that contacts the channel layer, and
a remaining portion of the gate insulating layer, which is separate from the surface portion, does not contain the impurity metal.

4. The transistor of claim 1, wherein the impurity metal containing region has a thickness of about 5 nm or less.

5. The transistor of claim 1, wherein the channel layer includes at least one of the group of an oxide semiconductor, an oxynitride semiconductor, an oxynitride semiconductor containing fluorine, a nitride semiconductor, and a nitride semiconductor containing fluorine.

6. The transistor of claim 1, wherein the channel layer comprises at least one of the group of a ZnO-based semiconductor, a SnO-based semiconductor, an InO-based semiconductor, a ZnON-based semiconductor, a ZnONF-based semiconductor, a ZnN-based semiconductor, and a ZnNF-based semiconductor.

7. The transistor of claim 6, wherein
the channel layer further includes at least one of the group of Li, K, Mg, Ca, Sr, Ba, Ga, Al, In, B, Si, Sn, Ge, Sb, Y, Ti, Zr, V, Nb, Ta, Sc, Hf, Mo, Mn, Fe, Co, Ni, Cu, W, La, Ce, Pr, Nd, Pm, Sm, Eu, Gd, Tb, Dy, Ho, Er, Tm, Yb, Lu, F, Cl, Br, I, S, and Se.

8. The transistor of claim 1, wherein
the gate insulating layer includes at least one of the group of a silicon oxide layer and a silicon nitride layer, and the gate insulating layer is one of the group of a monolayer structure and a multilayer structure.

9. The transistor of claim 1, wherein the channel layer is on top of the gate.

10. The transistor of claim 9, further comprising:
an etch stop layer on the channel layer.

11. The transistor of claim 1, wherein a threshold voltage of the transistor is increased in a positive (+) direction due to the impurity metal containing region.

12. A display apparatus comprising:
the transistor of claim 1.

13. The transistor of claim 1, wherein
the impurity metal containing region includes a first portion between the source electrode and the drain electrode, and
the first portion has a first surface directly contacting the impurity metal non-containing region and a second surface directly contacting the channel layer.

14. The transistor of claim 1, wherein the impurity metal containing region directly contacts an entire region of a lower surface of the channel layer.

15. The transistor of claim 1, wherein the impurity metal containing region comprises the same base material as the impurity metal non-containing region.

16. A transistor comprising:
a gate;
a channel layer that is separate from the gate;
a gate insulating layer between the gate and the channel layer,
the gate insulating layer including an impurity metal containing region that includes an impurity metal and contacts the channel layer,
the gate insulating layer including an impurity metal non-containing region that contacts the gate and is not doped with the impurity metal; and
a source electrode and a drain electrode respectively contacting a first region and a second region of the channel layer,
wherein the gate insulating layer includes at least one of the group of a silicon oxide layer and a silicon nitride layer, and the gate insulating layer is one of the group of a monolayer structure and a multilayer structure, and
wherein the gate insulating layer includes a silicon nitride layer and a silicon oxide layer that are sequentially stacked, and
the impurity metal containing region is in a surface portion of the silicon oxide layer.

17. A transistor comprising:
a gate;
a channel layer that is separate from the gate, the channel layer including an inorganic semiconductor, the channel layer including an iron (Fe) containing region at a surface portion thereof;
a source electrode and a drain electrode respectively contacting a first region and a second region of the channel layer; and
a gate insulating layer between the channel layer and the gate,
wherein the gate insulating layer includes an impurity metal containing region that includes an impurity metal at a surface portion of the gate insulating layer,
wherein the gate insulating layer includes an impurity metal non-containing region that contacts the gate and is not doped with the impurity metal, and
wherein at least a portion of the impurity metal containing region is between the impurity metal non-containing region and a portion of the channel layer between the source electrode and the drain electrode, the portion of the channel layer not overlapping the source electrode and the drain electrode.

18. The transistor of claim 17, wherein the channel layer includes at least one of the group of an oxide semiconductor, an oxynitride semiconductor, an oxynitride semiconductor containing fluorine, a nitride semiconductor, and a nitride semiconductor containing fluorine.

19. The transistor of claim 17, wherein the channel layer includes at least one of the group of a ZnO-based semiconductor, a SnO-based semiconductor, an InO-based semiconductor, a ZnON-based semiconductor, a ZnONF-based semiconductor, a ZnN-based semiconductor, and a ZnNF-based semiconductor.

20. The transistor of claim 17, wherein the iron (Fe) containing region has a thickness of about 5 nm or less.

21. The transistor of claim 17, wherein the gate is on top of the channel layer.

22. The transistor of claim 17, wherein the channel layer is on top of the gate.

23. The transistor of claim 17, wherein the impurity metal containing region includes iron (Fe) as the impurity metal.

24. A display apparatus comprising:
the transistor of claim 17.

* * * * *